(12) United States Patent
Scott et al.

(10) Patent No.: US 12,381,523 B2
(45) Date of Patent: *Aug. 5, 2025

(54) SYSTEMS AND METHODS FOR RADIO FREQUENCY POWER SYSTEMS

(71) Applicant: Epirus, Inc., Hawthorne, CA (US)

(72) Inventors: Alexander Paul Scott, Redondo Beach, CA (US); Michael Alex Borisov, Long Beach, CA (US); Maxwell Anthony Bilodeau, Redondo Beach, CA (US); Joseph Shin, Orange, CA (US); Albert Thomas Montemuro, III, Redondo Beach, CA (US); Denpol Kultran, Torrance, CA (US); Harry Bourne Marr, Jr., Manhattan Beach, CA (US); Bradley Travis Bassano, Long Beach, CA (US)

(73) Assignee: EPIRUS, INC., Hawthorne, CA (US)

( * ) Notice: Subject to any disclaimer, the term of this patent is extended or adjusted under 35 U.S.C. 154(b) by 543 days.

This patent is subject to a terminal disclaimer.

(21) Appl. No.: 17/853,782

(22) Filed: Jun. 29, 2022

(65) Prior Publication Data

US 2023/0102869 A1 Mar. 30, 2023

Related U.S. Application Data

(63) Continuation-in-part of application No. 17/365,915, filed on Jul. 1, 2021, now Pat. No. 12,068,618, and a
(Continued)

(51) Int. Cl.
| | |
|---|---|
| *H03F 3/24* | (2006.01) |
| *H04W 52/02* | (2009.01) |
| *H04W 76/10* | (2018.01) |

(52) U.S. Cl.
CPC ........ *H03F 3/245* (2013.01); *H04W 52/0225* (2013.01); *H04W 76/10* (2018.02); *H03F 2200/451* (2013.01)

(58) Field of Classification Search
CPC .............. H03F 3/245; H03F 2200/451; H03F 2200/168; H03F 2200/411;
(Continued)

(56) References Cited

U.S. PATENT DOCUMENTS

| | | | |
|---|---|---|---|
| 3,562,741 A | 2/1971 | McEvoy et al. | |
| 4,187,506 A * | 2/1980 | Frosch .................... | H02J 50/20 |
| | | | 310/306 |

(Continued)

FOREIGN PATENT DOCUMENTS

CN 111123258 A 5/2020

OTHER PUBLICATIONS

U.S. Patent and Trademark Office, Non-Final Office Action issued in U.S. Appl. No. 17/748,341, filed Oct. 18, 2022, pp. 1-5.
(Continued)

*Primary Examiner* — David A Vanore
(74) *Attorney, Agent, or Firm* — Pillsbury Winthrop Shaw Pittman LLP

(57) ABSTRACT

A compact directed energy system is disclosed that is configured to generate directed energy beams. The compact directed energy system includes a radio frequency system configured to provide a directed energy beam in a frequency range between 500 MHz to 20 Ghz.

14 Claims, 15 Drawing Sheets

Related U.S. Application Data continuation-in-part of application No. 17/354,971, filed on Jun. 22, 2021, now Pat. No. 12,003,223, which is a continuation-in-part of application No. 16/908,476, filed on Jun. 22, 2020, now Pat. No. 11,469,722.

(58) Field of Classification Search
CPC ... H04W 52/0225; H04W 76/10; H02J 50/20; B64U 10/14; B64U 20/70; B64U 2101/20
See application file for complete search history.

(56) References Cited

U.S. PATENT DOCUMENTS

| | | | |
|---|---|---|---|
| 4,430,577 A | 2/1984 | Bouquet | |
| 5,164,689 A | 11/1992 | Plonka | |
| 5,426,641 A | 6/1995 | Afrashteh et al. | |
| 5,880,648 A | 3/1999 | Aves et al. | |
| 6,362,449 B1 | 3/2002 | Hadidi et al. | |
| 6,756,843 B2 | 6/2004 | Charley et al. | |
| 7,242,518 B1* | 7/2007 | Lynch | H03F 3/72 |
| | | | 359/333 |
| 7,256,650 B1 | 8/2007 | Stockert | |
| 7,388,433 B1* | 6/2008 | Hecht | H03G 1/0088 |
| | | | 330/124 R |
| 7,479,691 B2 | 1/2009 | Ewe et al. | |
| 7,508,338 B2 | 3/2009 | Pluymers et al. | |
| 7,629,918 B2* | 12/2009 | Brown | G01S 7/38 |
| | | | 342/13 |
| 8,576,109 B2* | 11/2013 | Stark | F41H 13/0093 |
| | | | 307/106 |
| 8,712,344 B2 | 4/2014 | Wang et al. | |
| 8,718,580 B2* | 5/2014 | Borodulin | H03F 1/0288 |
| | | | 455/127.1 |
| 8,737,527 B2* | 5/2014 | Lozhkin | H03F 3/24 |
| | | | 375/295 |
| 8,737,531 B2* | 5/2014 | Saunders | H03H 11/20 |
| | | | 375/295 |
| 8,760,634 B2 | 6/2014 | Rose | |
| 9,065,163 B1 | 6/2015 | Wu et al. | |
| 9,111,949 B2 | 8/2015 | Yu et al. | |
| 9,455,695 B2 | 9/2016 | Kull et al. | |
| 9,518,554 B2 | 12/2016 | Mongin et al. | |
| 9,548,880 B2* | 1/2017 | Hori | H04B 1/04 |
| 9,825,593 B2* | 11/2017 | de Vreede | H03F 3/72 |
| 9,984,996 B2 | 5/2018 | Lu et al. | |
| 10,044,465 B1* | 8/2018 | Hetsko | H04K 3/90 |
| 10,224,184 B2 | 3/2019 | Van Zyl | |
| 10,237,012 B2* | 3/2019 | Morrow | H04K 3/65 |
| 10,289,184 B2 | 5/2019 | Malik et al. | |
| 10,304,669 B1 | 5/2019 | Coumou et al. | |
| 10,705,556 B2 | 7/2020 | Kapur et al. | |
| 10,760,879 B2* | 9/2020 | Stark | F41H 13/0093 |
| 10,938,347 B2 | 3/2021 | Rofougaran et al. | |
| 10,958,323 B1 | 3/2021 | Ben-Yishay et al. | |
| 10,987,440 B1* | 4/2021 | Sood | F04D 29/646 |
| 11,005,514 B2 | 5/2021 | Cordier | |
| 11,012,120 B2 | 5/2021 | Guillot et al. | |
| 11,094,507 B2 | 8/2021 | Funk et al. | |
| 11,158,942 B1 | 10/2021 | Scott et al. | |
| 11,184,739 B1* | 11/2021 | Wellig | H04W 4/021 |
| 11,187,499 B1* | 11/2021 | Fortney | H04K 3/62 |
| 11,211,703 B2 | 12/2021 | Marr, Jr. et al. | |
| 11,469,722 B2* | 10/2022 | Kultran | H03F 3/602 |
| 11,616,481 B2* | 3/2023 | Kultran | H03F 3/245 |
| | | | 330/295 |
| 12,068,618 B2* | 8/2024 | Scott | H02J 50/23 |
| 2003/0227330 A1 | 12/2003 | Khanifar et al. | |
| 2006/0049870 A1* | 3/2006 | Hellberg | H03F 1/3294 |
| | | | 330/136 |
| 2006/0128503 A1* | 6/2006 | Savarese | A63B 43/00 |
| | | | 473/353 |
| 2007/0139247 A1* | 6/2007 | Brown | H04K 3/62 |
| | | | 342/13 |
| 2008/0018519 A1* | 1/2008 | Berg | F41H 13/0068 |
| | | | 342/67 |
| 2008/0153435 A1* | 6/2008 | Hirano | H04B 1/525 |
| | | | 330/136 |
| 2008/0174469 A1 | 7/2008 | Stark et al. | |
| 2008/0297414 A1* | 12/2008 | Krishnaswamy | H03L 7/087 |
| | | | 342/368 |
| 2010/0237884 A1 | 9/2010 | Bult et al. | |
| 2011/0054271 A1 | 3/2011 | Derchak et al. | |
| 2011/0156813 A1 | 6/2011 | Kim et al. | |
| 2011/0253896 A1* | 10/2011 | Brown | G01S 13/86 |
| | | | 250/349 |
| 2012/0200281 A1 | 8/2012 | Herbsommer et al. | |
| 2013/0120190 A1 | 5/2013 | McCune, Jr. | |
| 2014/0266460 A1 | 9/2014 | Nobbe et al. | |
| 2015/0061769 A1 | 3/2015 | Bodnar | |
| 2015/0270806 A1 | 9/2015 | Wagh et al. | |
| 2016/0036113 A1 | 2/2016 | Wu et al. | |
| 2016/0049909 A1 | 2/2016 | Scherrer | |
| 2016/0127060 A1 | 5/2016 | Cross | |
| 2016/0282450 A1 | 9/2016 | Kishigami et al. | |
| 2017/0180011 A1 | 6/2017 | Charvat et al. | |
| 2017/0192089 A1* | 7/2017 | Parker | G01S 13/42 |
| 2017/0250778 A1* | 8/2017 | Stamm | G08B 6/00 |
| 2017/0359033 A1* | 12/2017 | Bazzani | H03F 1/22 |
| 2018/0058826 A1* | 3/2018 | Podgorski | H01Q 19/062 |
| 2018/0131102 A1 | 5/2018 | Wang | |
| 2018/0234203 A1* | 8/2018 | Hsiao | G08B 15/004 |
| 2018/0249133 A1* | 8/2018 | Thiel | H01M 50/242 |
| 2018/0342904 A1* | 11/2018 | Mantese | H02J 50/20 |
| 2019/0058448 A1 | 2/2019 | Seebacher | |
| 2019/0173605 A1* | 6/2019 | Morrow | H04K 3/825 |
| 2019/0208112 A1* | 7/2019 | Kleinbeck | G01R 29/0892 |
| 2019/0314535 A1* | 10/2019 | Golkowski | A61L 2/24 |
| 2020/0036334 A1 | 1/2020 | Witt et al. | |
| 2020/0054271 A1 | 2/2020 | Zerial et al. | |
| 2020/0227159 A1* | 7/2020 | Boisvert | G05B 15/02 |
| 2020/0395894 A1 | 12/2020 | Esmael | |
| 2021/0057813 A1 | 2/2021 | So et al. | |
| 2021/0231413 A1* | 7/2021 | Uyeno | G01S 13/867 |
| 2021/0399695 A1 | 12/2021 | Kultran et al. | |
| 2021/0399700 A1 | 12/2021 | Kultran et al. | |
| 2022/0045423 A1 | 2/2022 | Scott et al. | |
| 2022/0115782 A1 | 4/2022 | Marr et al. | |
| 2022/0158346 A1 | 5/2022 | Marr et al. | |
| 2022/0271569 A1* | 8/2022 | Marr, Jr. | H03F 3/21 |
| 2022/0277851 A1* | 9/2022 | Wellig | G16H 50/80 |
| 2022/0286097 A1 | 9/2022 | Kultran et al. | |
| 2023/0006478 A1* | 1/2023 | Scott | H02J 50/23 |
| 2023/0102869 A1* | 3/2023 | Scott | H04W 76/10 |
| | | | 370/311 |
| 2023/0261376 A1* | 8/2023 | Choi | H04B 7/04013 |
| | | | 342/367 |
| 2024/0088721 A1* | 3/2024 | Marr, Jr. | H02J 50/402 |

OTHER PUBLICATIONS

Patent Cooperation Treaty, International Search Report issued in PCT/IB2022/056085, Nov. 17, 2022, pp. 1-5.
United States Patent and Trademark Office, Official Action issued in U.S. Appl. No. 17/365,915, filed Oct. 31, 2023, pp. 1-14.
Patent Cooperation Treaty, International Search Report issued in PCT/US2020/021895, Jun. 9, 2020, pp. 1-2.
Manh et al., "An Independently Biased 3-stack GaN HEMT Configuration for 5G Mobile Networks", 2019 26th International Conference on Telecommunications (ICT), 2019, pp. 1-5, doi: 10.1109/ICT.2019.8798858.
Ampleon, "AN11226 TTL bias switching", Application note, Rev. 2, Sep. 1, 2015, pp. 1-13, The Netherlands B.V.
Barsegyan et al., "Bias Sequencing and Gate Pulsing Circuit for GaN Amplifier", 10th International Radar Symposium India, 2015, pp. 1-5, NIMHANS Convention Centre, Bangalore INDIA.
Wang et al., "60% Efficient 10-GHz Power Amplifier With Dynamic Drain Bias Control", IEEE Transactions on Microwave Theory and Techniques, Mar. 2004, pp. 1-5, vol. 52(3).

(56) References Cited

OTHER PUBLICATIONS

Sheppard et al., "High-Power Microwave GaN/AlGaN HEMT's on Semi-Insulating Silicon Carbide Substrates", IEEE Electron Device Letters, Apr. 1999, pp. 161-163, vol. 20(4).
Korovin et al., "Pulsed Power-Driven High-Power Microwave Sources", Proceedings of the IEEE, Jul. 2004, pp. 1082-1095, vol. 92(7).
Delos et al., "Unique Gate Drive Applications Enable Rapidly Switching On/Off for Your High Power Amplifier", Analog Dialogue 51-12, Dec. 2017, pp. 1-4.
Gold et al., "Review of high-power microwave source research", Review of Scientific Instruments 68, 1997, pp. 1-31, 68, 3945, https://doi.org/10.1063/1.1148382.
Schafer et al., "X-Band MMIC GaN Power Amplifiers Designed for High-Efficiency Supply-Modulated Transmitters", IEEE Xplore, 2013 IEEE MTT-S International Microwave Symposium Digest (MTT), Jun. 2-7, 2013, pp. 1-3.
Pajic et al., "X-Band Two-Stage High-Efficiency Switched-Mode Power Amplifiers", IEEE Transactions on Microwave Theory and Techniques, Sep. 2005, vol. 52(9).
Patent Cooperation Treaty, International Search Report and Written Opinion issued in PCT/US2021/038529, Nov. 10, 2021, pp. 1-12.
Patent Cooperation Treaty, International Preliminary Report on Patentability issued in PCT/US2022/022921, Oct. 3, 2023, pp. 1-6.

\* cited by examiner

SYSTEMS AND METHODS FOR RADIO FREQUENCY POWER SYSTEMS

RELATED APPLICATION(S)

This application is a continuation-in-part of U.S. patent application Ser. No. 17/365,915 titled "SYSTEMS AND METHODS FOR COMPACT DIRECTED ENERGY SYSTEMS" filed on Jul. 1, 2021, and is a continuation-in-part of U.S. patent application Ser. No. 17/354,971 titled "SYSTEMS AND METHODS FOR MODULAR POWER AMPLIFIERS" filed Jun. 22, 2021 which is a continuation-in-part of U.S. application Ser. No. 16/908,476 filed Jun. 22, 2020 titled SYSTEMS AND METHODS FOR MODULAR POWER AMPLIFIERS, which is related to both U.S. application Ser. No. 16/779,036 filed Jan. 31, 2020 titled "APPARATUS AND METHOD FOR SYNCHRONIZING POWER CIRCUITS WITH COHERENT RF SIGNALS TO FORM A STEERED COMPOSITE RF SIGNAL" and U.S. Provisional Application No. 62/817,096, filed Mar. 12, 2019, and is related to U.S. patent application Ser. No. 17/365,852 titled "SYSTEMS AND METHODS FOR POWER DISTRIBUTION FOR AMPLIFIER ARRAYS" filed on Jul. 1, 2021, the contents of which are hereby incorporated by reference in their entireties.

DESCRIPTION OF THE RELATED ART

Radio-frequency (RF) applications often involve amplifying a RF signal to a power level suitable for applications in defense, policing, industrial applications, or the like. Amplifier arrays can be of significant size in order to contain the required number of amplifiers and to be capable of delivering the high-power RF required for some applications.

SUMMARY

In one aspect, a compact directed energy system is disclosed that is configured to generate directed energy beams. The compact directed energy system comprises a radio frequency system configured to provide a directed energy beam in a frequency range between 500 MHz to 20 Ghz.

In some variations, the compact directed energy system can be further configured to be mounted to an unmanned aerial vehicle and configured to generate directed energy beams during a flight of the unmanned aerial vehicle.

In other variations, the compact directed energy system can also be sufficiently compact to be handheld by a user or contained in a backpack.

In yet other variations, the directed energy beam can be in frequency range between 500 MHz and 5 GHz or in frequency range between 500 MHz and 1 GHz.

In some variations, the compact directed energy system can further comprise: a housing substantially enclosing components of the compact directed energy system comprising: a radio frequency (RF) signal generator; an amplifier system configured to amplify signals from the RF signal generator; a battery power system configured to supply power to the RF signal generator and the amplifier system; and a bias power controller configured to sense a characteristic of the amplifier system and adjust bias power to the amplifier system based on the sensed characteristic, wherein a ratio of a radiated power generated by the compact directed energy system to a volume of the housing is greater than about 0.001 kW/cm3 and less than about 5000 kW/cm3.

In some variations, the housing can be configured to be mounted on the unmanned aerial vehicle. A ratio of the radiated power generated by the compact directed energy system to a volume of the housing can be greater than about 0.22 W/cm3 and less than about 2500 kW/cm3.

In other variations, the compact directed energy system can further comprise: a housing enclosing: a radio frequency (RF) signal generator configured to generate a plurality of phase shifted signals; an array of amplifiers configured to amplify the plurality of phase shifted signals; a battery power system configured to supply power to the array of amplifiers; and a bias power controller configured to sense a characteristic of an amplifier in an array and adjust bias power to the amplifier based on the sensed characteristic, wherein a volume of the housing is between 1000 cm3 and 100,000 cm3.

In some variations, the volume of the housing can be approximately 15000 cm3. In other variations, the sensed characteristic comprises an input signal power, an output signal power, a gain, a current, a voltage, a temperature, a resistance, a capacitance, or an inductance.

In other variations, the compact directed energy system can comprise: a housing configured to be mounted to the unmanned aerial vehicle, the housing containing: an electronic processing system, an array of amplifiers configured to amplify a plurality of radio frequency (RF) signals; and a battery power system configured to supply power to the array of amplifiers, wherein the electronic processing system is configured to dynamically change a power or a frequency of the directed energy beam generated by the compact directed energy system.

In some variations, the compact directed energy system can further comprise a bias power controller configured to sense a characteristic of an amplifier in the array of amplifiers and adjust bias power to the amplifier based on the sensed characteristic.

In some variations, the battery power system comprises a plurality of capacitors configured to provide DC power during operation of the RF system.

In other variations, the compact directed energy system further comprises: a housing substantially enclosing: an array of amplifiers configured to amplify signals from a plurality of signal sources; and a battery power system configured to supply power to the array of amplifiers, wherein the radio frequency system is configured to generate a directed energy beam towards a target electronic system, and wherein the signals from the plurality of signal sources are configured to have a frequency matched to a resonance frequency of the target electronic system.

In yet other variations, the compact directed energy system further comprises a wireless transceiver, wherein the compact directed energy system is configured to: count a number of completed RF pulses delivered by the compact directed energy system, and automatically reestablish a wireless connection utilizing the wireless transceiver when the number of completed RF pulses is equal to a desired number of pulses.

In some variations, the compact directed energy system further comprises a power management system, wherein the power management system is configured to: count a number of completed RF pulses delivered by the compact directed energy system, and automatically enter an idle state when the number of completed RF pulses is equal to a desired number of pulses, where the idle state includes one or more components operating at reduced power until a next pulse train is initiated.

In an interrelated aspect, a system is disclosed that includes an RF power source comprising an RF generator configured to generate RF signals having a wavelength, amplifiers configured to receive and amplify the RF signals from the RF generator, and a power management system configured to control one or more of the amplifiers based on information received that is associated with the RF signals.

In some variations, a housing can contain components of the RF power source, the housing having a front panel and a rear panel, the housing including a power input port and RF output port. The housing can also include an error indicator, an RF indicator, a synch in, and a synch out. The housing can have a power switch and one or more fans.

In other variations, the system can include a rack configured to receive the RF power source, the rack having one or more spacers to create a separation between the RF power source from another RF power source. The separation can be at least approximately 0.5 times the wavelength, at least approximately 0.3 times the wavelength, within the L-band, or between approximately 3-7 inches.

In yet other variations, the RF power source can be configured to generate a plurality of wavelengths of RF signals and the separation is approximately the smallest wavelength of the plurality of wavelengths.

In some variations, the RF power source can further include: a power amplifier subsystem having a first 90 degree hybrid block configured to receive an RF signal and output a split RF signal with components having a 90 degree phase shift; a second 90 degree hybrid block configured to receive and combine the split RF signal by removing the 90 degree phase shift; and a high-power amplifier, in the plurality of amplifiers, configured to amplify at least one of the components of the split RF signal; and a power sequencer configured to control the timing of power delivery by the power distribution module.

In other variations, the system can include a first high-power amplifier configured to receive a first RF signal and output a first amplified RF signal; a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier, wherein the different orientations have an angle of 90 degrees between them to form a portion of a square distribution of high-power amplifiers; and a third high-power amplifier having an orientation substantially perpendicular to the first high-power amplifier and a fourth high-power amplifier having an orientation substantially perpendicular to the second high-power amplifier.

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features. Similarly, computer systems are also contemplated that may include one or more processors and one or more memories coupled to the one or more processors. A memory, which can include a computer-readable storage medium, may include, encode, store, or the like, one or more programs that cause one or more processors to perform one or more of the operations described herein. Computer implemented methods consistent with one or more implementations of the current subject matter can be implemented by one or more data processors residing in a single computing system or across multiple computing systems. Such multiple computing systems can be connected and can exchange data and/or commands or other instructions or the like via one or more connections, including but not limited to a connection over a network (e.g., the internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to particular implementations, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

The present disclosure incorporates by reference the subject matter of U.S. application Ser. No. 17/365,852 titled "SYSTEMS AND METHODS FOR POWER DISTRIBUTION FOR AMPLIFIER ARRAYS" filed on Jul. 1, 2021 and U.S. application Ser. No. 17/354,971 titled "SYSTEMS AND METHODS FOR MODULAR POWER AMPLIFIERS." These incorporated references are co-owned by the present application's applicant and have several common inventors. This incorporation is intended to provide additional enabling disclosure of some features described herein. However, there may be differences in the terms used for similar or identical elements between the present application and the incorporated reference. Where different terms may describe an identical or substantially identical component, feature, or operation, it is understood that a person of skill would find appropriate equivalence such that the incorporated reference can clearly provide disclosure of a corresponding component, feature, or operation described herein. In particular, the incorporated reference provides additional technical details on power distribution units and especially their proximity to a load (e.g., an antenna). In addition to providing technical features related to efficient power distribution and stability, such "Point of Load" (PoL) concepts facilitate the compactness of the disclosed systems discussed herein.

Figure 1:
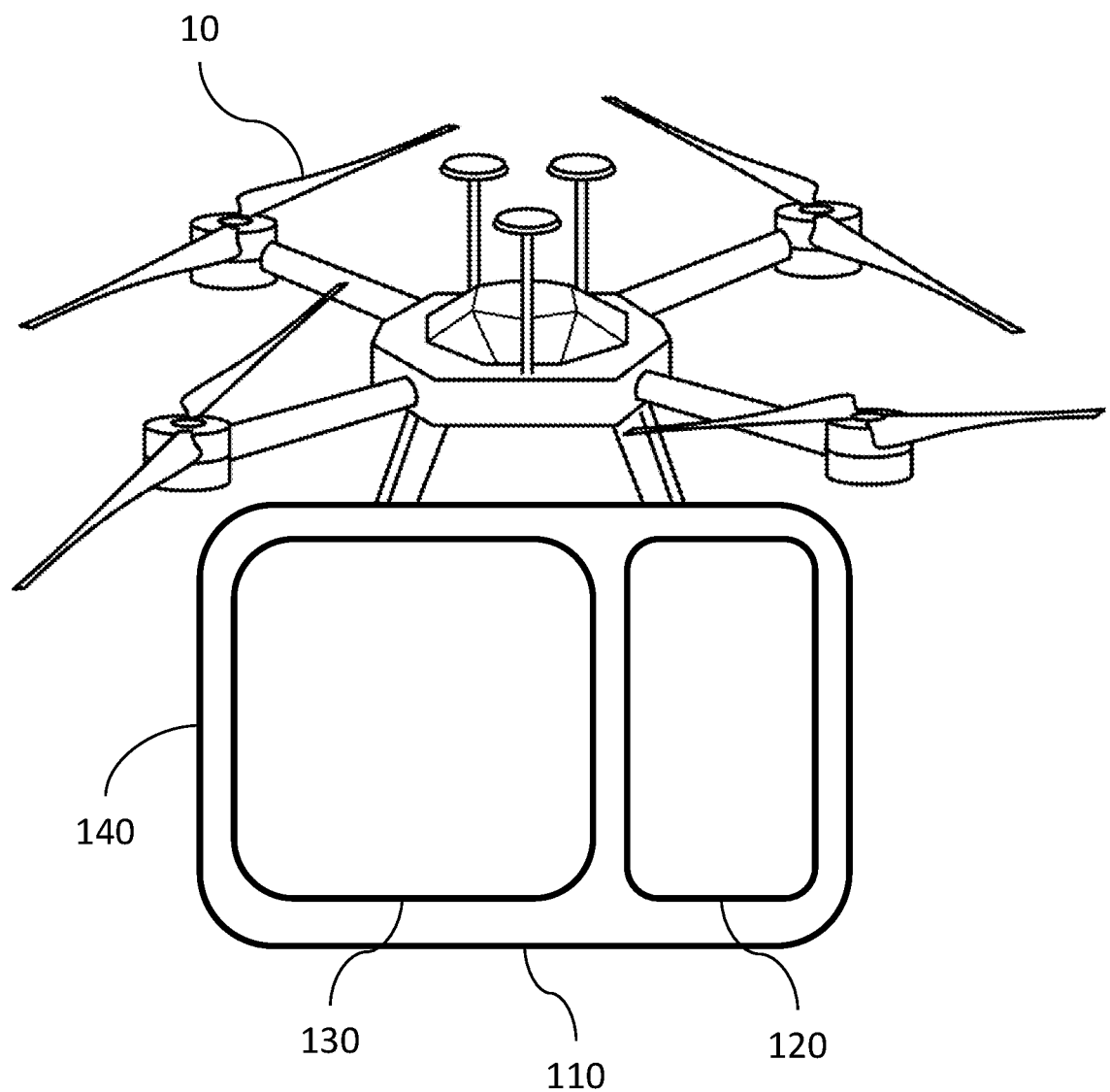
FIG. 1 is a diagram illustrating a compact directed energy system mounted to an unmanned aerial vehicle, in accordance with certain aspects of the present disclosure.

FIG. 1 is a diagram illustrating a compact directed energy system mounted to an unmanned aerial vehicle. The compact directed energy system 110 can be configured to generate directed energy beam(s). As used herein, the term "compact directed energy system" refers to the overall system and any components that may or may not be directly related to the generation of RF energy. For example, "compact directed energy system can comprise housings, mounting hardware, or the like.

As shown in FIG. 1, in some embodiments, the compact directed energy system can be configured to be mounted to an unmanned aerial vehicle (UAV) 10 and configured to generate directed energy beams during a flight of the unmanned aerial vehicle. The antenna(s) 120 and their RF generating system(s) 130 described herein can be contained in a housing 140 that can be mounted to the UAV. The compact sizes of the housings and power densities (in terms of delivered RF power versus housing volume) are described elsewhere herein.

In other embodiments, the compact directed energy system 110 can be sufficiently compact to be handheld by a user or be contained in a backpack. For example, certain implementations of the compact directed energy system can have a volume less than 16 ft.$^3$ and/or have a weight less than 300 pounds. In other implementations, the compact directed energy system to move on less than 4 ft.$^3$ and have a weight less than 100 pounds.

The compact directed energy system can comprise a radio frequency system configured to provide a directed energy beam. In some embodiments, the directed energy beam can be in a frequency range between 500 MHz to 20 Ghz. Conventional RF generation systems utilize amplifiers and circuit designs that are not suitable for generating the power required a system for compact applications such as UAV-mounted, handheld, etc. Complications include the high power level, managing thermal loading of the amplifier, providing the pulsed DC power to the amplifiers and shielding the EMI of an Electromagnetic Pulse Phased Array Emitter in a small package.

As used herein, the term "radio frequency system" refers to any components utilized for the generation and delivery of RF energy. For example, the radiofrequency system can comprise batteries, signal conditioning electronics, amplifiers, sensors, antennas, etc.

Also as used herein, the term "directed energy beam" refers to RF output (e.g., from the radio frequency system) in a frequency range between 500 MHz and 20 GHz. As such, in other embodiments can be in frequency range between 500 MHz and 5 GHz or between 500 MHz and 1 GHz. The term "directed" is not excluding of other embodiments and is instead intended to mean directed at a target or directed outward such that the generated RF energy may affect a potential target. For example, the compact directed energy system can be configured as a phased array system comprising a RF signal/waveform generator, high-power amplifiers configured to amplify the generated RF signal and one or more antennas to radiate the amplified RF signal as a directed energy beam. In various implementations, the RF signal/waveform generator can generate a plurality of phase shifted RF signals which are amplified and provided as an input to an antenna array. The output from the antenna array can be spatially combined to form a directed energy beam. In some implementations, the phase difference between the plurality of phase shifted RF signals can be configured such that the generated beam can have nulls (reduced/minimum energy) in certain spatial regions and peaks (increased/maximum energy) in other spatial regions. In some implementations, the phase difference between the plurality of phase shifted RF signals can be configured such that the generated beam doesn't have any nulls within the beam width. In some implementations, the compact directed energy system can be configured to generate multiple directed energy beams which may be in different directions.

In an embodiment, the compact directed energy system can generate a directed energy beam in the form of an electromagnetic pulse (EMP) such that the generated RF can be delivered over a substantial portion of a sphere (i.e., $4\pi$ steradians) surrounding the antenna(s). The delivered RF energy (either as a beam or as an EMP) can be delivered in a single burst or in multiple bursts such as part of a pulse train.

Figure 2A:
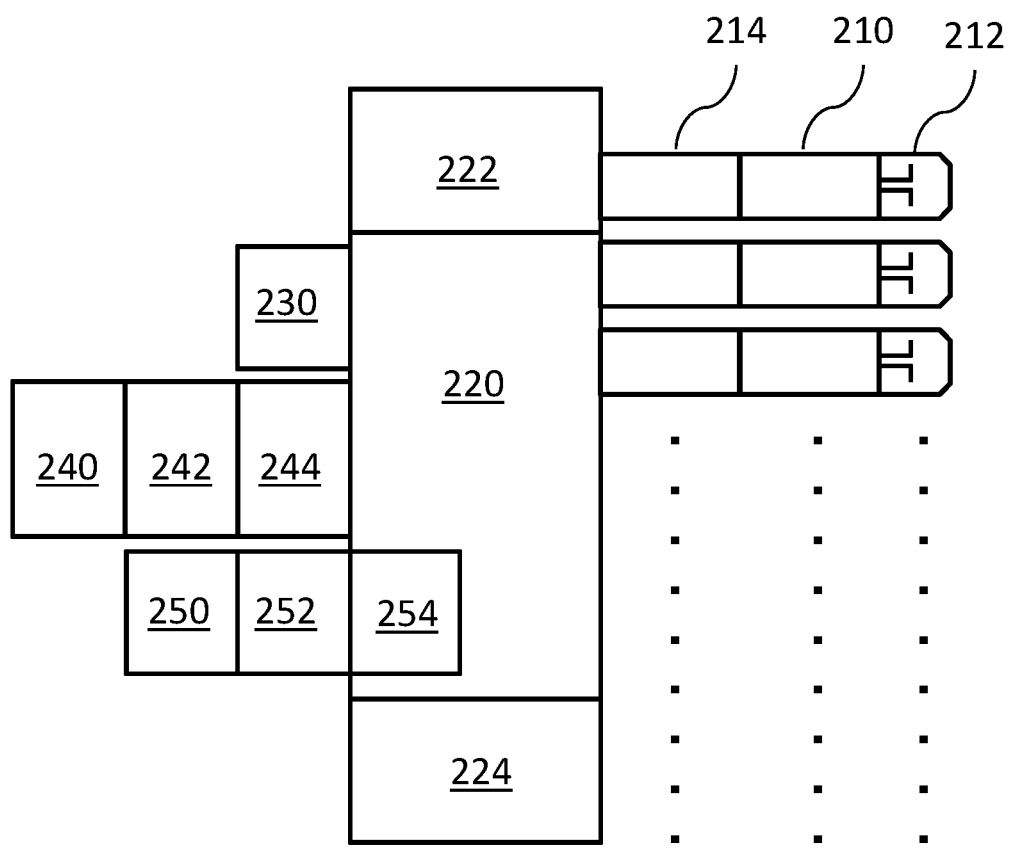
FIG. 2A is a diagram illustrating a schematic view depicting a centered mounting of a radio frequency system, in accordance with certain aspects of the present disclosure.

FIG. 2A illustrates a schematic view depicting a centered mounting of a radio frequency system. The mounting shown in FIG. 2A can be used to realize the compact directed energy system 110 discussed above. Certain embodiments of the present disclosure can comprise radiofrequency systems having a center of gravity as close as possible to a geometric center of the compact directed energy system. Some embodiments can comprise the radio frequency system having amplifiers 210 connected to a backplane configured to support portions of the radiofrequency system. Such portions comprise, for example, amplifier 210, antenna 212, and/or driver amplifier board 214. Though three of the above assemblies are depicted in FIG. 2A, is also indicated that there may be any number of such assemblies depending on the desired configuration. For example, there can be 6, 8, 10, 12, 14, etc. assemblies. The backplane can comprise one or more circuit boards or other such substrate (e.g., a printed circuit board (PCB)). In some embodiments, depending on the number of amplifiers/antennas utilized, the backplane can comprise a central backplane 220 and one or more backplane extensions configured to support additional portions of the radiofrequency system. The central backplane (and the components disposed thereon) can be configured to perform a variety of functions including, but not limited to, RF signal conditioning, distribution of the RF signals to the amplifiers, power distribution, and distribution of digital control to the amplifiers.

In some embodiments, the central backplane and the backplane extensions can be approximately centered along an axis extending through a center of gravity of the compact directed energy system. To facilitate maintaining the center of gravity in a desired location, backplane extensions can be symmetrically disposed about the central backplane. For example, certain embodiments can comprise a left extension 222 and/or right extension 224. The table below provides exemplary system configurations where there are two rows of antennas and 3 to 6 columns of antennas (see also, FIGS. 5 and 6, clearly depicting a 2×3 configuration—having 6 assemblies/antennas). The table below illustrates certain combinations of where antennas can be connected to a respective backplane or extension. Embodiments are depicted in bold and underline where either no extension is utilized, or the extensions are symmetric about the central backplane. Other configurations are also disclosed where the extensions result in a nearly centered configuration. The examples in the table are only a portion of the contemplated combinations of antennas and their dispositions.

|  | System Configuration | | | |
| --- | --- | --- | --- | --- |
|  | 2 × 3 | 2 × 4 | 2 × 5 | 2 × 6 |
| Central backplane | 2 × 2 or 2 × 3 | 2 × 2 or 2 × 2 | 2 × 2 or 2 × 3 | 2 × 2 |
| Left Extension | 2 × 1 or N/A | 2 × 1 or 2 × 2 | 2 × 2 or 2 × 1 | 2 × 2 |
| Right Extension | N/A | 2 × 1 or N/A | 2 × 1 or 2 × 1 | 2 × 2 |

FIG. 2A also illustrates other electronic components of the radiofrequency system. For example, the radiofrequency system can comprise signal conditioning unit 230, wireless command-and-control 240, a "system on module" (SoM) 242, a carrier card 244, a battery management system/charger 250, a battery 252, and a power distribution system 254. The signal conditioning unit 230 independently or in collaboration with the system on module 242 is configured to generate and condition RF signal(s). Conditioning of the RF signals can include but not be limited to adjusting frequency, amplitude, pulse width, pulse repetition rate of a RF signal. In some implementations, the signal conditioning unit 230 can be configured to adjust the phase difference between multiple RF signals. The wireless command and control 240 can comprise a wireless communication interface to provide commands and control signals to manage the operation of the radio frequency system. The carrier card 244 can provide a mounting option to the various components of the radio frequency system as well as providing input and output interfaces, peripherals and power supplies for the various components of the radio frequency system. In some implementations, the carrier card 244 can be a field programmable gate array (FPGA) control card.

The battery 252 can provide power to the various components of the radiofrequency system. The battery management system 250 can be configured to monitor the state (e.g., output voltage, temperature, etc.) of the battery 150, ensure that the battery is operating in the safe operating region, provide alerts to when the battery needs to be charged, or the like.

The power distribution system 254 is configured to receive power from the battery 252 and convert the received power to voltages and currents required to driver the high-power amplifier 210 and the driver amplifiers 214. In various implementations, the power distribution unit 254 can comprise a distributed array of power converters connected to the battery 252. A power converter in the distributed array can be positioned proximal to the corresponding high-power amplifier 210 and/or the driver amplifier 214 that it provides to. For example, in FIG. 2A, the power distribution unit 254 comprises a first power converter configured to generate currents and voltages required to drive the high-power amplifier 210 and a second power converter configured to generate currents and voltages required to drive the driver amplifier 214. The first and the second power converters are positioned proximal to the respective amplifiers that they drive. For example, the each of the first and the second power converters can be integrated with the corresponding amplifier on the same substrate. In some implementations, the power converters can be connected to the corresponding amplifiers by microwave traces. In some implementations, the power converters can be connected to the corresponding amplifiers by wires have lengths less than 5 inches. Positioning the power converters closer to the amplifiers they drive can advantageously reduce the parasitic inductances and/or capacitances resulting from long cables as well as realize compact size. Further details of the distributed array of power converters are discussed in further detail below with FIG. 9 as well as in U.S. application Ser. No. 17/365,852 which is incorporated by reference herein in its entirety.

Figure 2B:
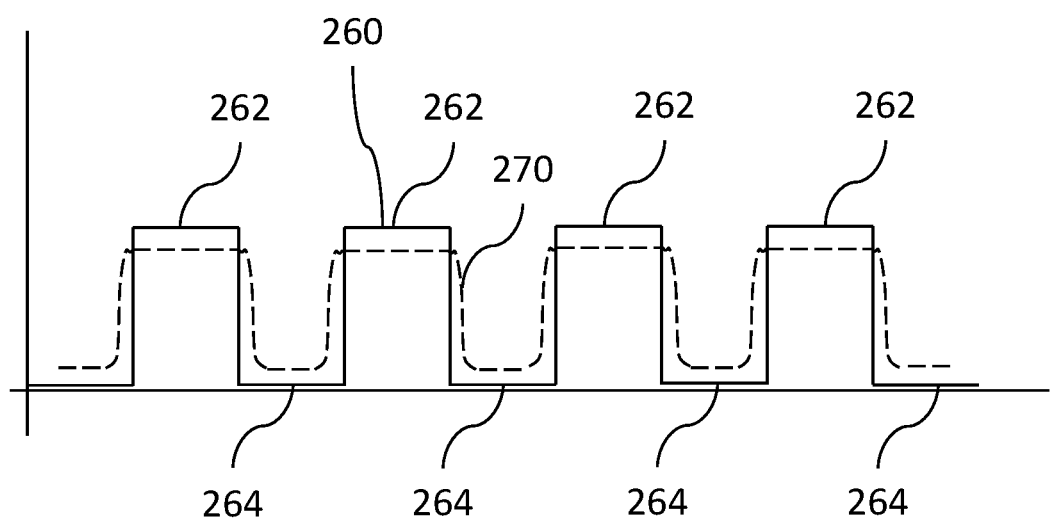
FIG. 2B illustrates an exemplary process of powering down components during an RF duty cycle, in accordance with certain aspects of the present disclosure.

FIG. 2B illustrates an exemplary process of powering down components during an RF duty cycle. Any of the embodiments of the present disclosure can also be configured for inter-pulse power savings. For example, components including RF signal generators such as a digital direct synthesis (DDS) circuit, clock generators such as a phase locked loop (PLL), etc. can be powered up when the system is about to emit or emitting RF pulses and powered down when the system is not providing amplified RF. In various embodiments, the powering down can include fully halting power consumption of these components or going into a sleep mode where the power is a fraction (e.g., 1%, 5%, 10%, etc.) of what is typically required during pulsed operations. The components can be put into power saving modes during "off" portions of the transmit duty cycle, with power restored before the "on" portion of the transmit duty cycle. FIG. 2B depicts an example where duty cycle 260 (depicted here as a 50% duty cycle, though any duty cycle can be implemented) has "on" portions 262 and "off" portions 264 where RF is to be generated or not generated, respectively. Before an "on" portion 262, power 270 to a component can be restored as needed throughout the RF pulse, then decreased after the pulse, or when no longer needed. While the example shown has the power coming on before the duty cycle, this is only one possible embodiment. For instance, if power is not needed until later in an "on" portion, the power may be delayed until just before it is needed. Similarly, if power is no longer needed even during the "on" portion, power may be reduced prior to the end of the "on" portion. Accordingly, without any loss of generality, power to the active components of the system, such as, for example, RF generator and amplifier can be synchronized with emission of the electromagnetic pulses.

In various implementations, the power saving functions disclosed herein can be controlled by a controller (e.g., carrier card 244). In some implementations, the controller can be implemented as a FPGA, a microcontroller, an ASIC, etc. The controller can also monitor the battery (e.g., battery 252) and, when the energy in the battery is below a threshold (e.g., 5%, 10%, etc.) it can cause the system to transmit a message to another control system such as a command computer, that the battery needs recharging. The controller, which may be part of a power management system, battery management system 250, or similar such controllers as disclosed in the various embodiments herein, can be configured to control one or more amplifiers (e.g., amplifiers 210) to turn on at once or in sequence. The sequence of may vary and may include any number of amplifiers. For example, in a six-amplifier system (e.g., amplifiers 1-6), in one embodiment the amplifiers may turn on one at a time (1, 2, 3 . . . 6). In another embodiment, the amplifiers may turn on in groups, (1,2), (3,4), then (5,6), etc. Accordingly, the present disclosure contemplates that any combination of amplifier activation can be utilized, depending on the application. Such embodiments can also be combined with other power saving features as disclosed herein, e.g., powering up components only during "on" times, but in the specified sequence needed. Such features have other technical advantages besides power savings, for example reducing battery inrush current as compared to when all (or more) amplifiers are activated at once. In some embodiments, prior to activating the next amplifier in the sequence, the system can be configured to wait for a status indicator to show that the current amplifier is powered up. The overall system power status can be determined and monitored by comparing the status indicators of the amplifiers with channel enables (e.g., confirming that each amplifier that should be powered up, is powered up). In some embodiments, in addition to standard pulse generation, a FPGA can generate different waveforms by modulating the RF signal output during a pulse. For example, such modulation can include frequency, amplitude, and/or phase modulation. While the functionality disclosed herein for power control can be implemented with a single controller, in other embodiments multiple independent controllers can be utilized and configured to independently control a subset of amplifiers.

Figure 2C:
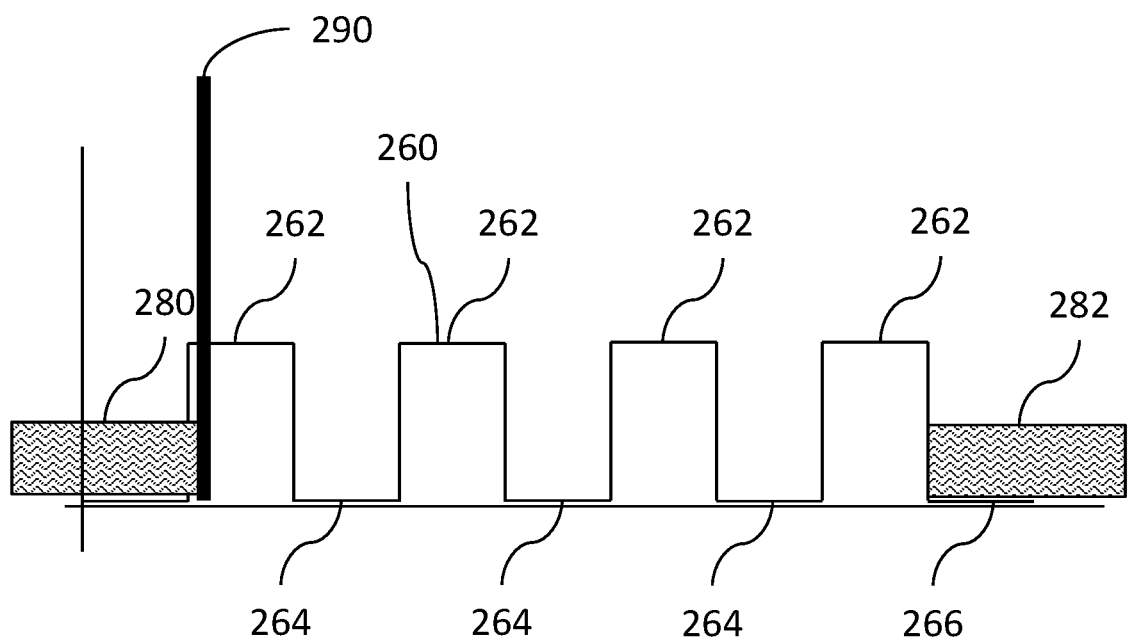
FIG. 2C illustrates exemplary actions of a compact energy system responsive to completion of a programmed pulse sequence, in accordance with certain aspects of the present disclosure.

FIG. 2C illustrates exemplary actions of a compact energy system responsive to completion of a programmed pulse sequence. Battery management system 250 (or similar power management systems described in other embodiments herein) can be configured to include several features that support remote operation or operation in the presence of strong electromagnetic fields which may interfere with onboard systems. As shown in FIG. 2C, prior to the initiation of a pulse train (represented diagrammatically by the duty cycle 260 introduced in FIG. 2B), the compact directed energy system may be in wireless communication 280 (represented in FIG. 2C by the regions extending along the horizontal time axis) with one or more remote computers, such as mission control computers. When a pulse train is initiated, there may be an interference event 290 such as a strong electromagnetic pulse, transient currents or voltages, or other forms of electrical interference that may interrupt wireless connection 280 operating through a wireless transceiver. To address this situation, some embodiments can include counting the number of RF pulses delivered by the compact directed energy system and when the number of pulses completed is equal to the desired number of pulses (which number may have been previously received via said wireless connection, stored in onboard computer memory, etc.) the compact directed energy system can perform one or more actions. Such actions can include automatically reestablishing a wireless connection 282 utilizing the wireless transceiver, as depicted in FIG. 2B as occurring after the final pulse in the pulse train. Another example of an action can include automatically entering idle state 266, similar to the power saving functions described above, where one or more components are operated at reduced power until the next pulse train is initiated. Also, in various embodiments, the action of entering an idle state need not be related to the interference event and can instead be an independent feature of the system. While the features in FIGS. 2B and 2C are described primarily with respect to the compact directed energy systems, such features can be included in any of the embodiments herein such as those with rack mounted amplifiers, stand-alone amplifiers (without an antenna), etc.

Figure 3:
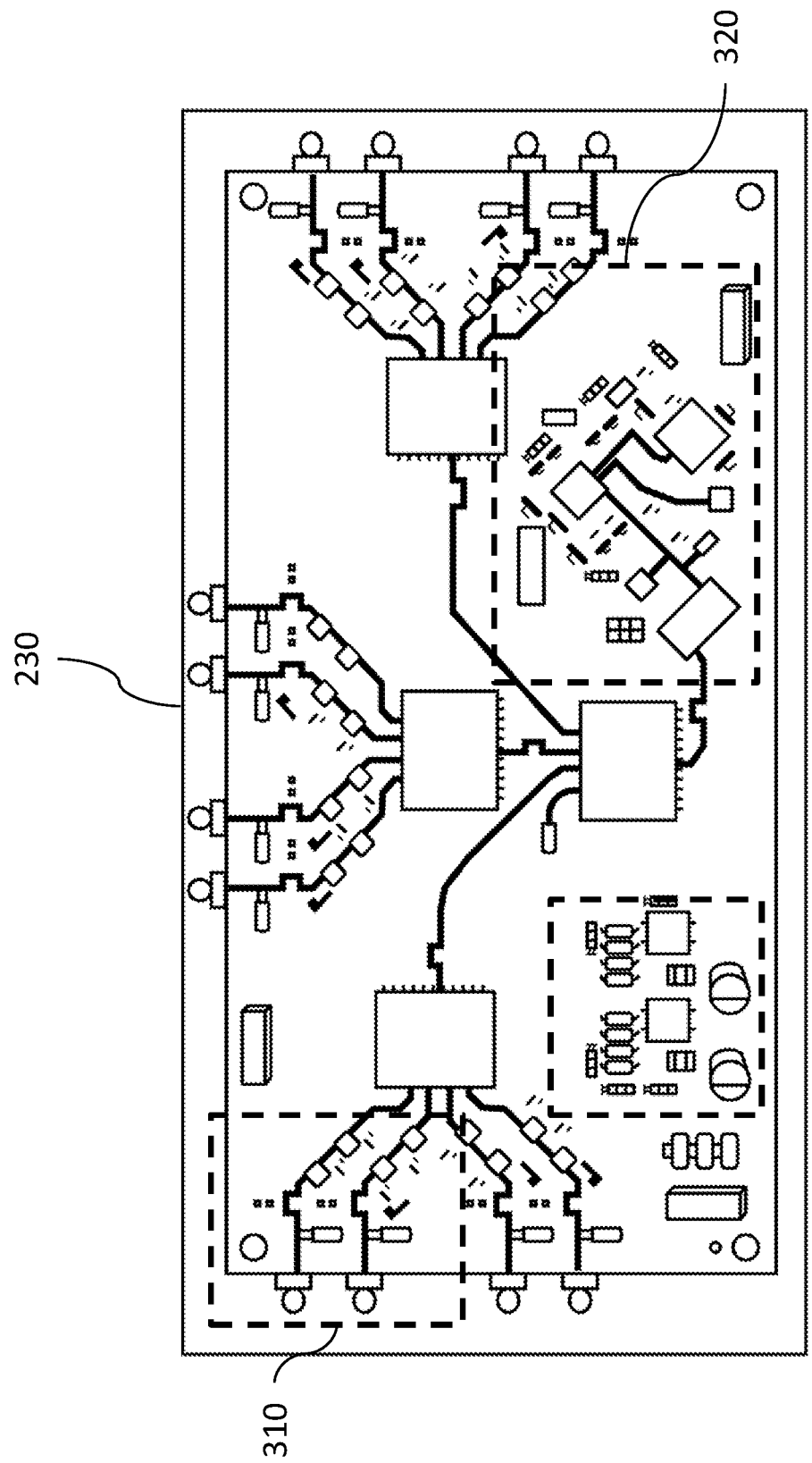
FIG. 3 is a diagram illustrating an exemplary signal conditioning unit facilitating the disclosed compact directed energy systems, in accordance with certain aspects of the present disclosure.

FIG. 3 illustrates an exemplary signal conditioning unit facilitating the disclosed compact directed energy systems. Implementations of signal conditioning unit 230 can comprise phase shifters and attenuators 310, power input and regulation 320, and RF generation 330 on a single board. Phase shifters and attenuators 310 enable individual RF Channel control enabling electronic beam steering and power adjustment. Power input and regulation 320 can comprise, for example, batteries, power distribution units, power management boards, etc. RF generation 330 can comprise, for example, amplifiers, rectifiers, etc.

Figure 4:
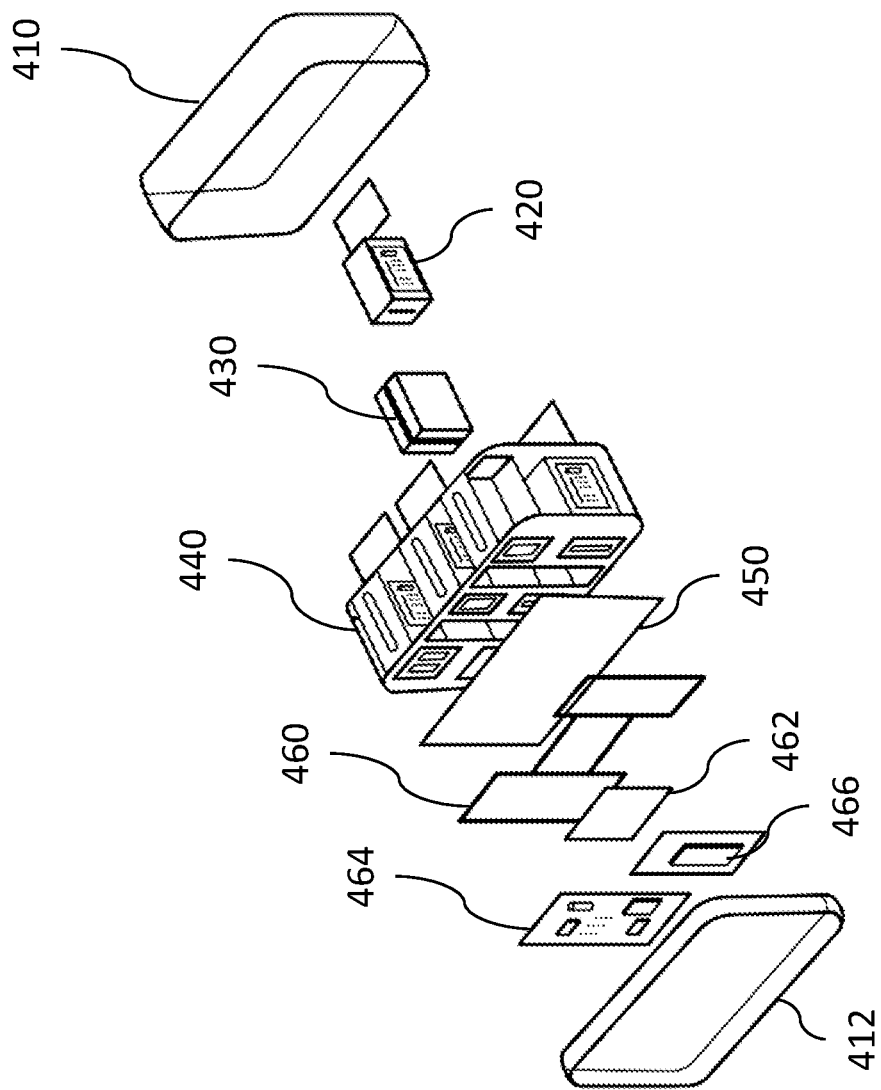
FIG. 4 is an exploded view illustrating a compact directed energy system having a front-mounted battery, in accordance with certain aspects of the present disclosure.
Figure 5:
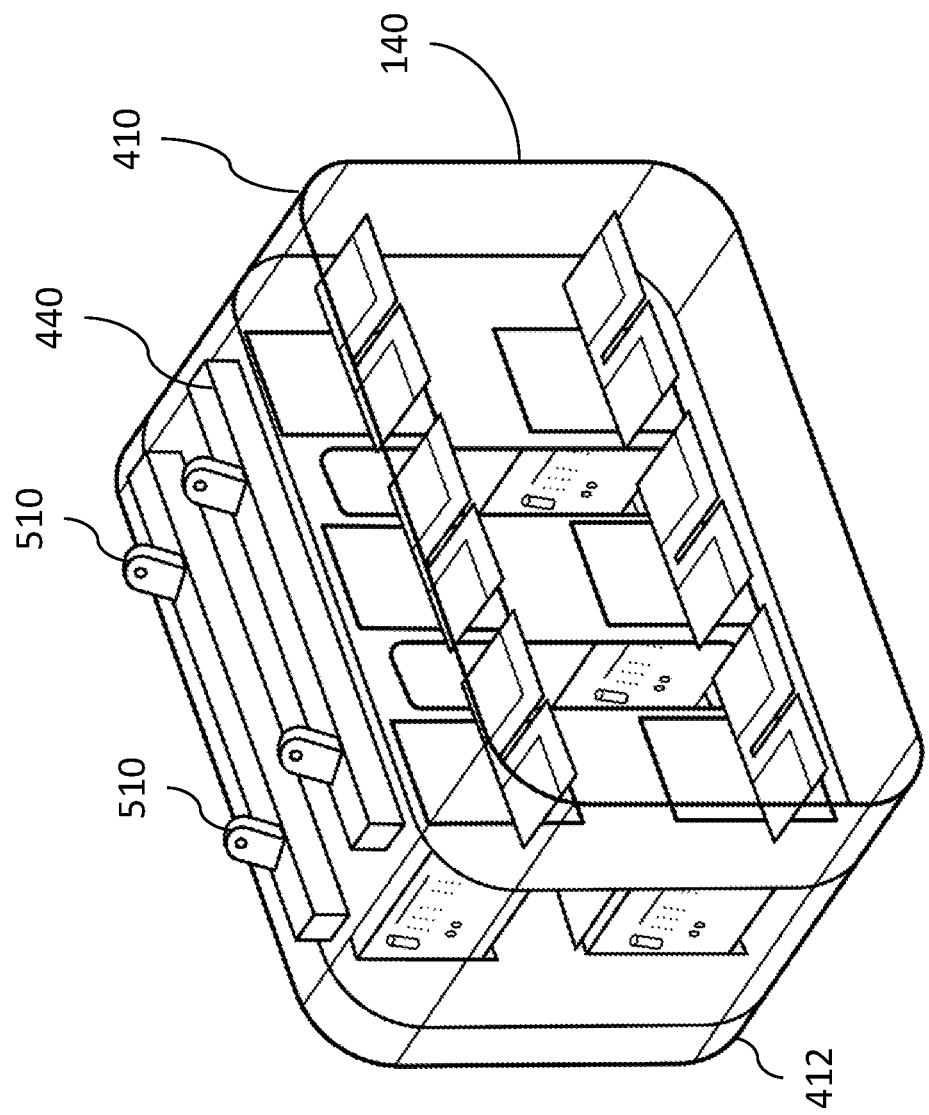
FIG. 5 is an assembled view illustrating the compact directed energy system of FIG. 4, in accordance with certain aspects of the present disclosure.
Figure 6:
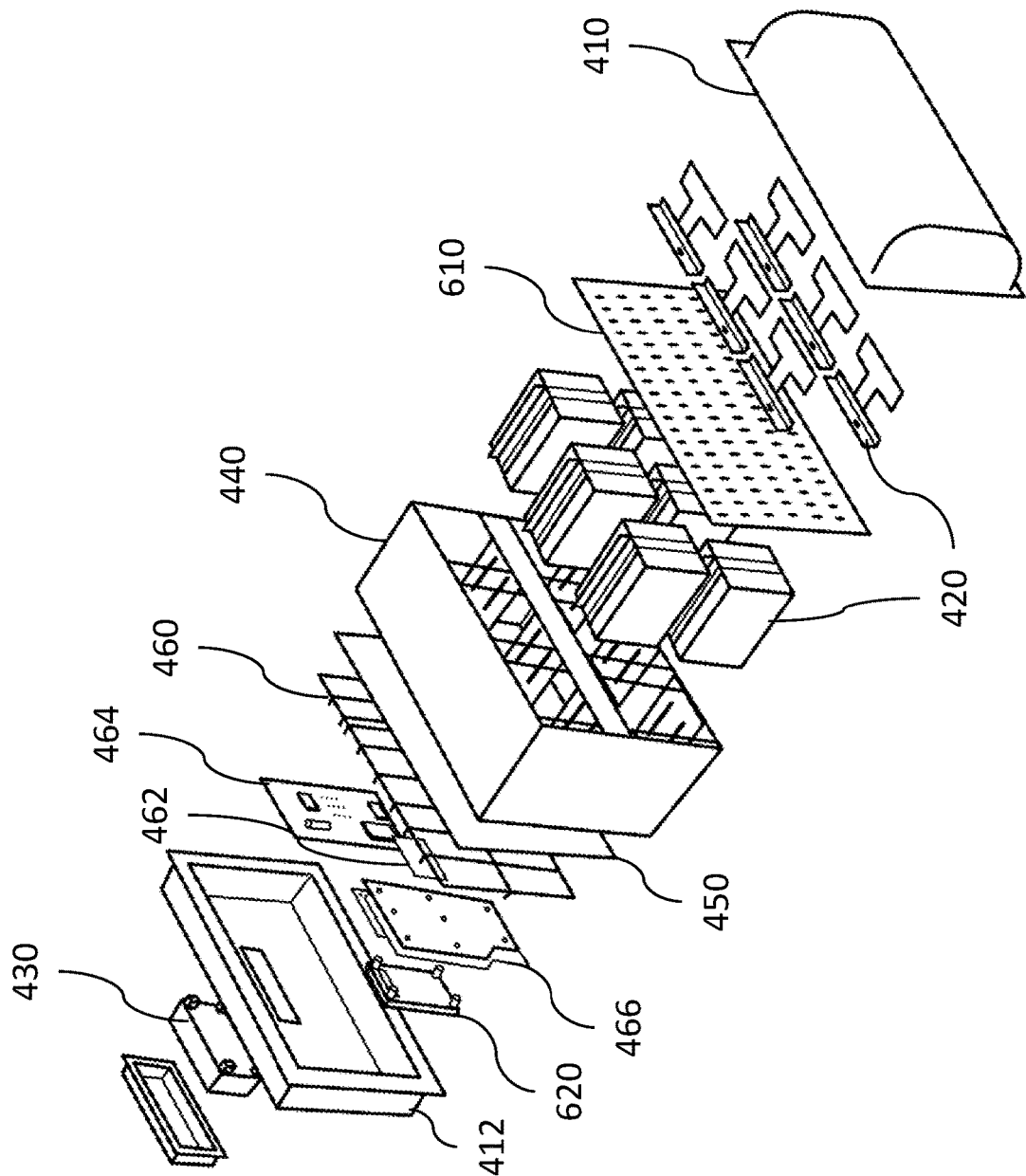
FIG. 6 is an exploded view illustrating a compact directed energy system having a rear-mounted battery, in accordance with certain aspects of the present disclosure.

FIG. 4 illustrates an exploded view of a compact directed energy system having a front-mounted battery. FIG. 5 illustrates an assembled view of the compact directed energy system of FIG. 4. FIG. 6 illustrates an exploded view of a compact directed energy system having a rear-mounted battery.

As depicted in FIGS. 4 and 6, a housing can substantially enclose components of the compact directed energy system. As depicted in FIG. 4, the housing can comprise, for example, a radome 410 and a rear cover 412. The radome can be a shell or other protective cover that permits transmission of the RF power emitted from the antennas. In some implementations, the radome can be configured to have minimal attenuation of the generated RF power. For example, the radome can be constructed of fiberglass or plastic.

Other components in FIG. 4 can comprise amplifiers and their respective antennas 420, a battery 430, and a primary structure 440 that may comprise a ground plane and/or a cooling solution. In certain embodiments, the cooling solution may be utilized when the housing itself does not comprise active cooling (e.g., water cooling). Cooling solution can comprise fins, fans, etc. yet other components can comprise backplane 450, which may be similar to the backplane embodiments previously described. There may also be a mounting bracket 460 which can be symmetrically constructed to mount a power management board 462, a signal conditioning unit 464, and a carrier card with a "system on module." Such mounted components can be similar to other embodiments disclosed herein.

FIG. 5 depicts the embodiment of FIG. 4 but assembled, illustrating the compact design of the disclosed compact directed energy system. An example of mounting brackets 510 are also depicted that may facilitate attachment of the housing 140 (comprising at least radome 410 and rear cover 412) to devices such as UAVs.

FIG. 6 depicts an embodiment similar to FIG. 4. However, in FIG. 6, the compact directed energy system is shown with a ground plane to provide the grounds at various locations in the disclosed circuitry. Also depicted is an exemplary heatsink with a thermal pad for dissipating heat from the power management board and SOM.

Accordingly, certain configurations of the disclosed compact directed energy systems can comprise a similar collection of components such as, a radio frequency (RF) signal generator, an amplifier system configured to amplify signals from the RF signal generator. In some embodiments, the amplified signals can be phase-shifted. The components can also comprise a battery power system configured to supply power to the RF signal generator and the amplifier system, and a bias power controller. In certain embodiments, the amplifier system can comprise a solid-state amplifier and may be configured to output electromagnetic (EM) radiation in the L-band. In certain other embodiments, the amplifier system can comprise solid-state amplifiers configured to output EM radiation in S-band, K-band etc. In certain embodiments, the amplifier system can comprise a first amplifier configured to output EM radiation in a first frequency range (e.g., L-band) and a second amplifier configured to output EM radiation in a second frequency range (e.g., S-band or K-band). In some embodiments, the bias power controller can be configured to sense a characteristic of the amplifier system and adjust bias power to the amplifier system based on the sensed characteristic. The sensed characteristic can comprise, for example, an input signal power, an output signal power, a gain, a current, a voltage, a temperature, a resistance, a capacitance, or an inductance.

In some implementations, the compact design of the disclosed systems can result in the volume of the housing being between 1000 cm$^3$ and 100,000 cm$^3$. For example, certain embodiments can have a volume of approximately 50,000, 25,000, 15,000, 10,000, or 5,000 cm$^3$. The power generated in terms of the volume of the housing of the compact directed energy system can be described in certain implementations as follows. A ratio of radiated power generated by the compact directed energy system to a volume of the housing can be greater than about 0.001 kW/cm$^3$ and less than about 5000 kW/cm$^3$. In other embodiments, the ratio can be greater than about 0.22 W/cm$^3$ and less than about 2500 kW/cm$^3$. Accordingly, embodiments with high power densities can be utilized with compact designs such as for those that may be implemented on an unmanned aerial vehicle.

Figure 7:
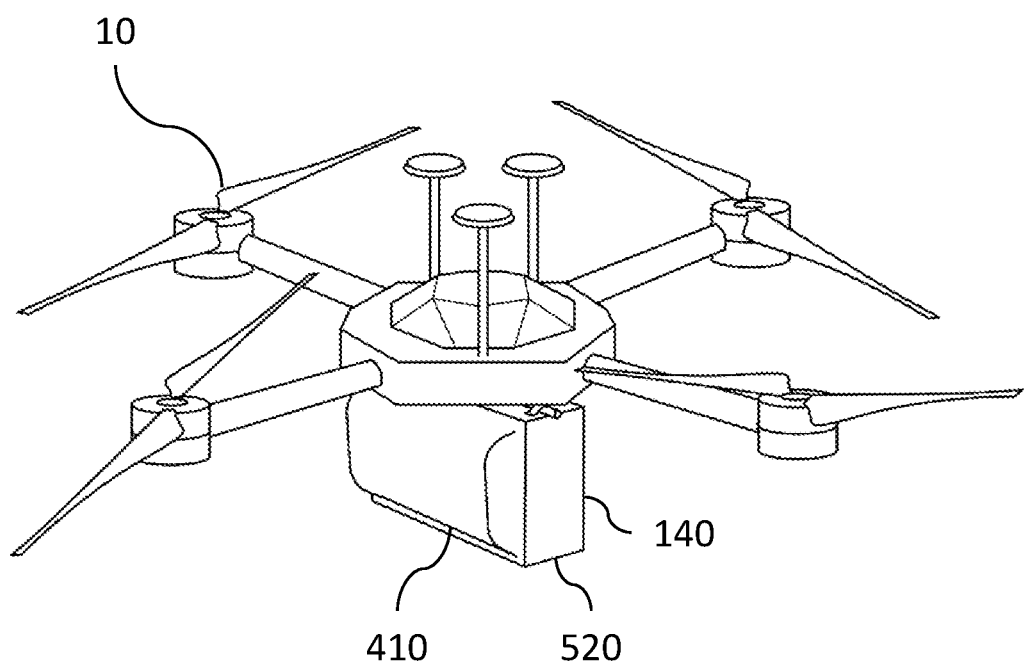
FIG. 7 is a diagram illustrating a compact directed energy system mounted to an unmanned aerial vehicle, in accordance with certain aspects of the present disclosure.

FIG. 7 illustrates a compact directed energy system mounted to an unmanned aerial vehicle. The efficient and compact design of the disclosed RF generation systems permit RF energy to be generated utilizing hardware having a much smaller volume as compared to conventional RF generation systems. In some embodiments, the housing can be configured to be mounted on the unmanned aerial vehicle. As previously mentioned, in other embodiments, the housing can be sufficiently sized for handheld use or carrying in a backpack.

Figure 8:
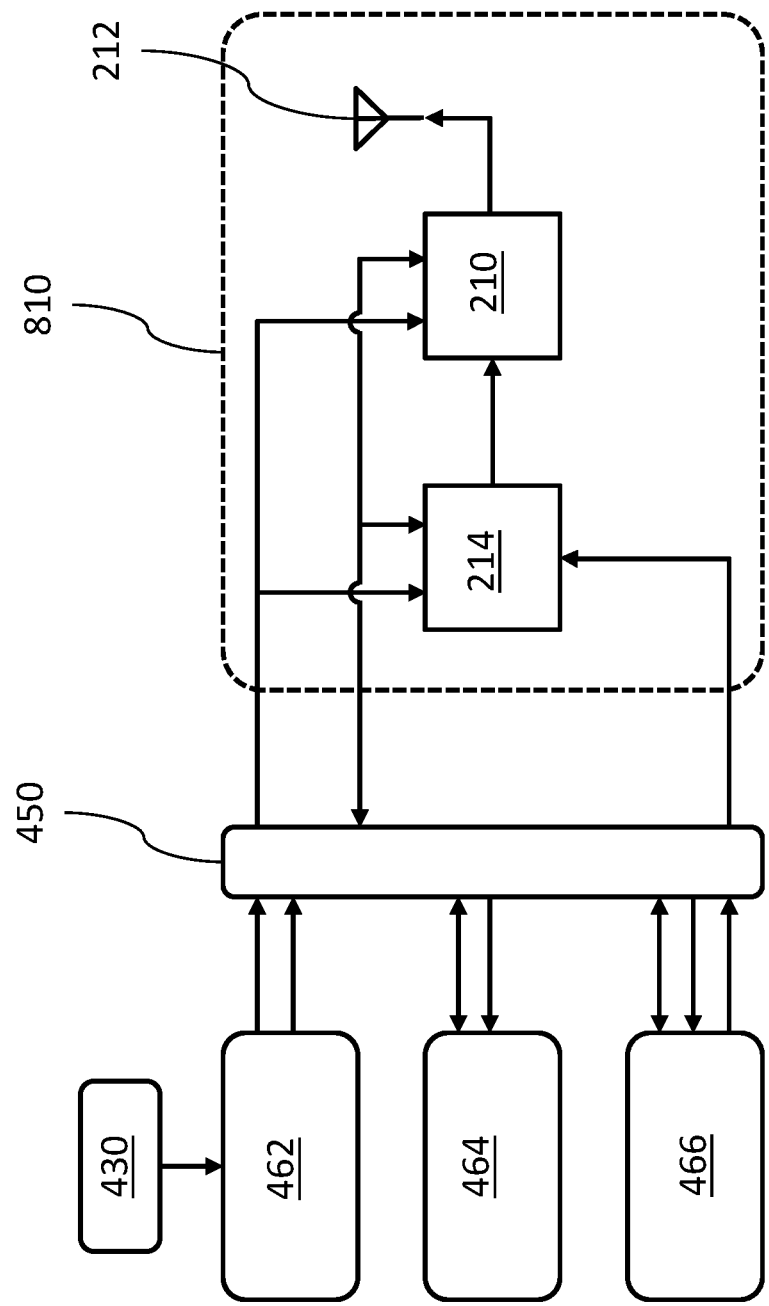
FIG. 8 is a block diagram illustrating functional relationships between components of the compact directed energy system, in accordance with certain aspects of the present disclosure.

FIG. 8 is a block diagram illustrating functional relationships between components of the compact directed energy system. The power management board (PMB) 462 can be configured to interface with a 28V-48V battery 430. The PMB can distribute voltage to the HPA/DAB assembly 810 (e.g., including driver amplifier board (DAB) 214 and high-power amplifier 210) via backplane 450. In some implementations, the battery can provide its output voltage in addition to 10 V supply to the backplane. 10V power provides one example of a lower voltage distribution to allow for a more efficient voltage step down to power low power peripherals. In some implementations, a serial peripheral interface (SPI) can provide communication between various components (e.g., 464, 466, 210, and 214). The SPI can be a low-speed digital interface for passing control/command messages to downstream devices.

The HPA/DAB assembly 810 can comprise a current sensing system that can measure a time averaged current and be configured to shut down the DAB and HPA if the time averaged current exceeds a threshold current value. This advantageously prevents damage to the HPAs and DAB s from high current values.

Figure 9:
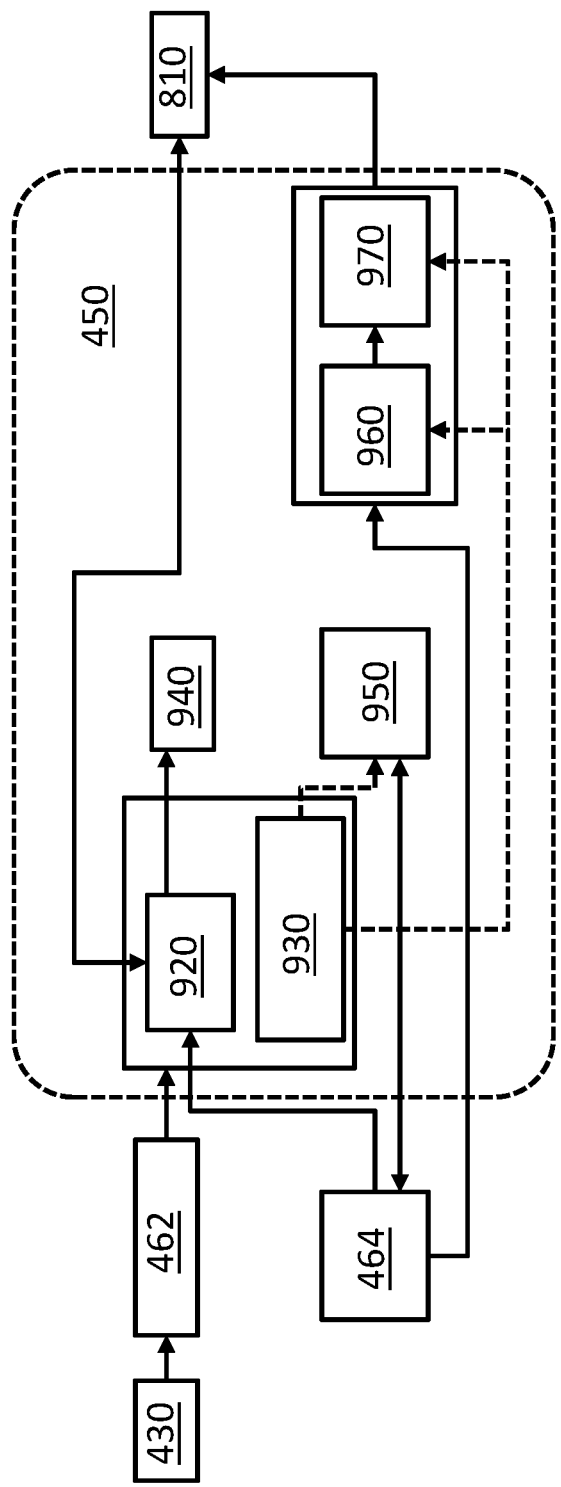
FIG. 9 is a block diagram illustrating components of compact directed energy system as located on a PoL PDU board, in accordance with certain aspects of the present disclosure.

FIG. 9 is a block diagram illustrating components of compact directed energy system as located on a PoL PDU board 910. As described in other embodiments, and expanded on in the Incorporated reference, certain components of the compact directed energy system can be located proximate each other to reduce unwanted capacitance among other technical benefits. FIG. 9 depicts a number of components located on POL PDU board 910. FIG. 9 also depicts high voltage regulator 920 (providing, for example, 65V or 50V to current sensor 940) and low voltage regulator 930 (providing, for example, ±–5V or +3.3V to analog to digital converter (ADC) 950). The low voltage regulator can also provide power to digital-to-analog converter (DAC) 960 and bias controller 970. Further details that may be in some implementations are discussed below.

The power management board (PMB) can convey the DC voltage from the battery and deliver via high voltage rails/lines +65V (for HPA) or +50V (for DAB). PMB can also deliver via low voltage rails/lines ±5V to ADCs as well as to DACs to deliver +3.3V to a current sensor provided in the output path delivering the high voltage to the DAB/HPA. In some implementations, the low voltages of ±5V or 3.3V can be generated by an intermediate voltage regulating system that generates ±12V. In implementations of the HPAs/DABs comprising a HEMT/FET amplifying device, the current sensor can be configured to sense the drain current drawn by the HEMT/FET amplifying device. The output of the current sensor can be digitized by the ADC and sent to the SoM which can monitor the drain current and reduce the voltage at the gate terminal of the HEMT/FET amplifying device to below the cutoff voltage of the HEMT/FET amplifying device, if the drain current exceeds a certain threshold. In various implementations, the SoM can adjust the gate bias voltage of the HEMT/FET amplifying device from a first value to a second value in response to the monitored drain current or other parameters of the HEMT/FET amplifying device including but not limited to temperature, gain, characteristics of the input RF signal, characteristics of the output RF signal, linearity of the device, etc. The SoM can generate a digital offset voltage equal to the difference between the first and the second voltage which is converted by a digital to analog converter and added to the total gate bias voltage provided to the gate terminal of the HEMT/FET amplifying device. In various implementations, the high-voltage PoL PDU board can have current limiters or other current sensors that can be configured to shut-down the switches of the high-voltage PoL PDU board if the current output from the high-voltage PoL PDU board exceeds a threshold value.

In some implementations, a compact directed energy system can be configured to dynamically change aspects of the output RF for a specific task (e.g., disrupting a target electronic device). Accordingly, certain implementations of compact directed energy systems can comprise a housing configured to be mounted to the unmanned aerial vehicle that substantially encloses an electronic processing system, an array of amplifiers configured to amplify RF signals, and a battery power system configured to supply power to the array of amplifiers. The electronic processing system can be one or more programmable processors configured by software to perform various operations utilizing the disclosed systems. For example, the electronic processing system can be configured to dynamically change a power or a frequency of the directed energy beam generated by the compact directed energy system.

As part of this dynamic operation, some embodiments can comprise identifying a target via visual identification (e.g., image recognition), electromagnetic signature, etc. Once identified, software can determine the power and/or frequency to be delivered by the radiofrequency system. In some embodiments, the identification can comprise identifying a resonance frequency based on physical dimensions of components identified in images of the target (e.g., rotors, engines, etc.). In other embodiments, for example when the target is not immediately identifiable or no predefined parameters for the RF exist, diagnostic or test pulses may be emitted towards the target. A receiver can detect the reflected signals and determine how to dynamically change the power and/or frequency.

In some embodiments, similar determinations can comprise identifying a resonance frequency of one or more electronic components in the target. The RF system can comprise signal sources (e.g., RF signal generator) that can be configured to have a frequency matched to a resonance frequency of the target electronic system. The matched RF may then cause a resonant condition in the target that can cause an overload of electronic components or other disruption.

Details of other features that may be present in any combination are described below. In some implementations, RF signals can be generated by an RF signal generator or by multiple RF signal generators. There can be a bias power controller configured to sense a characteristic of an amplifier in the array of amplifiers and adjust bias power to the amplifier based on the sensed characteristic. The processing system can be configured to dynamically change a position of the directed energy beam (e.g., a target position for the directed energy beam). The housing can also contain an array of antennae configured to receive the amplified RF signals. The array of antennae can emit pulsed electromagnetic radiation, and, in some embodiments, the pulsed electromagnetic radiation can comprise multiple pulses with a duty cycle less than 5%, less than 10%, less than 25%, etc.

In various implementations, the battery power system can comprise at least one battery. The battery power system can comprise multiple capacitors configured to provide DC power during operation of the RF system. The RF signals can be phase shifted with respect to each other or can be synchronized with each other.

Figure 10:
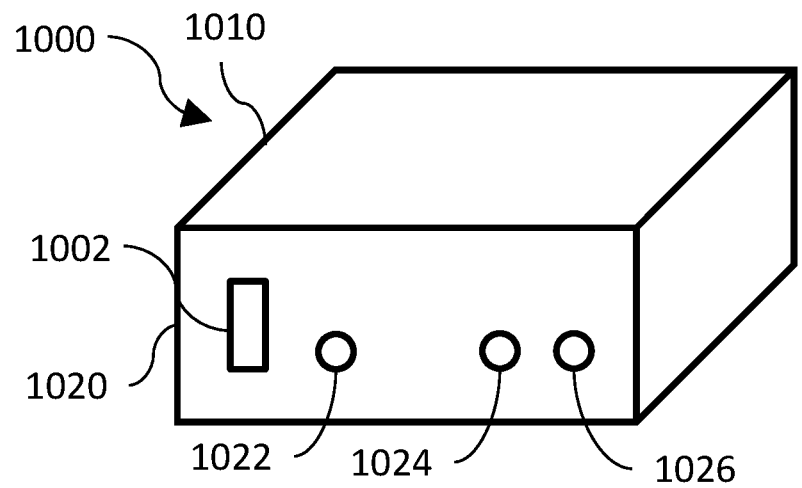
FIG. 10 is a diagram illustrating an exemplary modular power amplifier, in accordance with certain aspects of the present disclosure.
Figure 10:
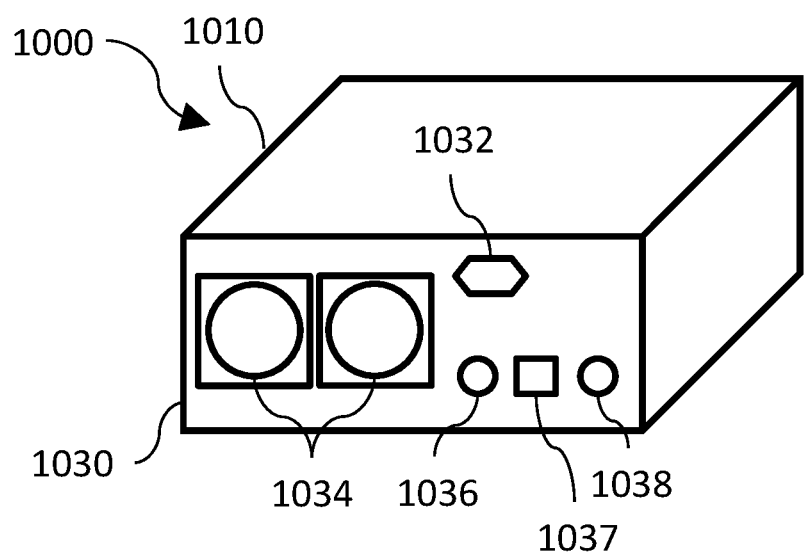

FIG. 10 is a diagram illustrating an exemplary modular power amplifier 1000. FIG. 10 is an external view showing varying input/output ports for power, data, RF output, etc. Modular power amplifier 1000 can be contained in housing 1010, with a front view of the housing shown in the upper portion of FIG. 10 and a rear view of the housing shown in the lower portion of FIG. 10. Any of the elements depicted in the example of FIG. 10 can be disposed on any part of the housing, including on the front, rear, or sides, with one example configuration depicted in FIG. 10 and described below.

Front panel 1020 can include, in any combination, an on/off switch 1022, an error indicator 1024, an RF indicator 1026, and an RF output port 1028. Error indicator 1024 can provide a visual indication to user on the presence and/or status of an error. Such can be provided by flashing lights, emitted light color, etc., to indicate the error status. RF indicator 1026 can also provide an indication whether RF is available at RF output port, and in certain embodiments, may also include flashing, intensity, color, etc. to provide additional information about the intensity and/or type of RF available at RF output port 1028. RF output port 1028 can be port for a coaxial cable, and can include, for example, BNC, SHV, SMA, SMB, or MHV type connections, etc.

Rear panel 1030 can include, in any combination, a power input port 1032 to provide power for the modular power amplifier, one or more fans 1034 to provide cooling to the internal electrical components, and a synch in 1036 and synch out 1038. Synch in 1036 and synch out 1038 can receive/send synchronization pulses from/to another device for synchronizing operation of the modular power amplifier 1000 and/or providing triggering information from the amplifier to another device to enable it to be synchronized with modular power amplifier 1000. In some embodiments, computer interface port 1037 (e.g., an ethernet, USB, or other such type of data/control port) can be included to allow an external computer to connect with and control modular power amplifier 1000. The modular power amplifier 1000 can be configured as a RF power source that can provide RF pulsed power or continuous RF power for a variety of applications.

Figure 11:
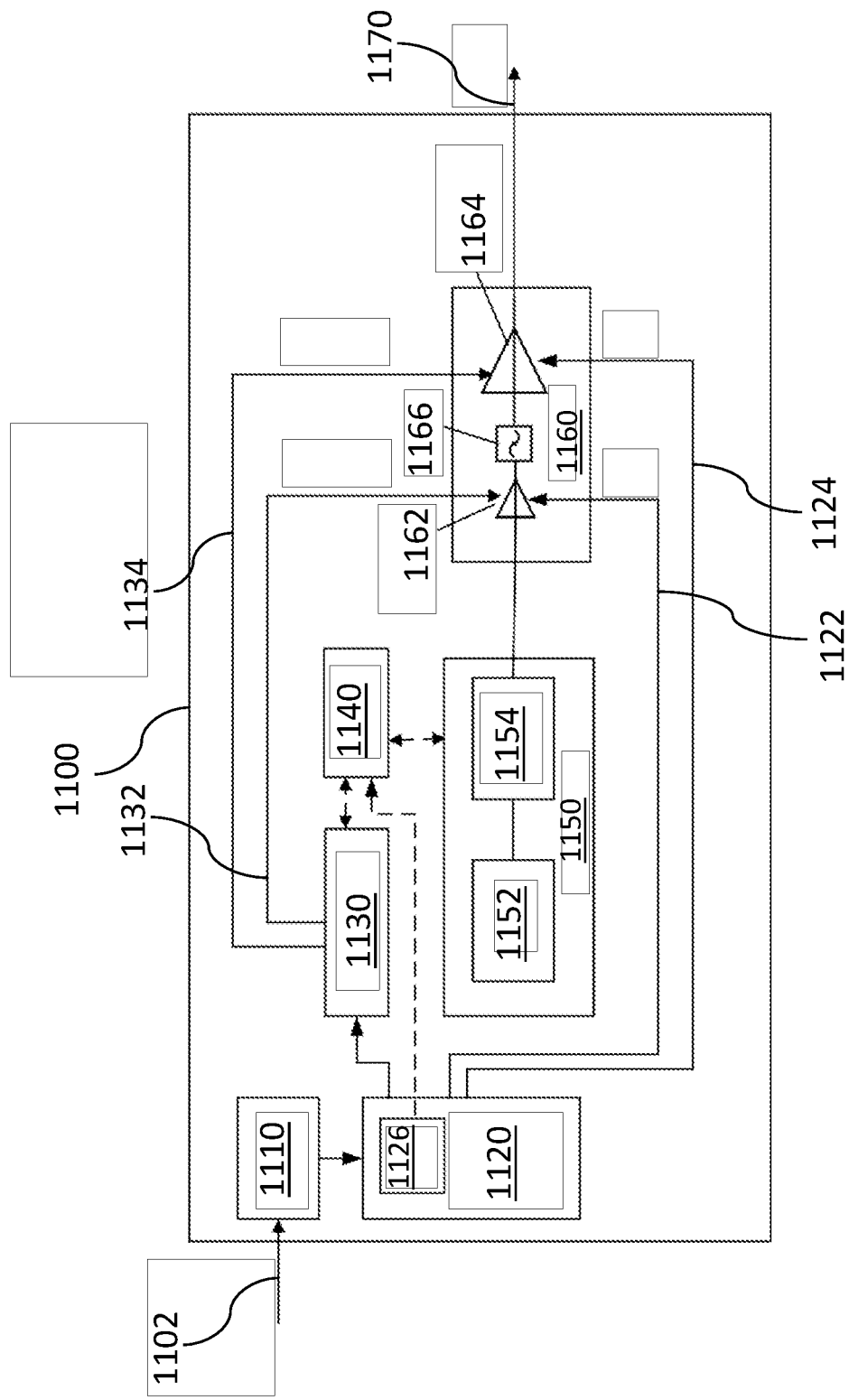
FIG. 11 is a diagram illustrating a simplified electrical schematic for a modular power amplifier, in accordance with certain aspects of the present disclosure.

FIG. 11 is a diagram illustrating a simplified electrical schematic for a modular power amplifier. Modular power amplifier 1100 can be similar in many respects to the amplifiers disclosed herein and can contain many of the same components. However, the depicted design need not be identical to any other disclosed embodiment nor is it essential that it contain any particular combination of components.

Modular power amplifier 1100 can receive external power 1102 (e.g., 120 VAC, 230 VAC, etc.). The external power can then be converted to DC power by AC/DC converter 1110, which can then be fed into bias power supply 1120.

Bias power supply 1120 can provide power to power management system 1130 and drain voltages to various amplifiers in amplifier chain 1160. For example, in the embodiment shown, bias power supply 1120 can provide driver drain voltage 1122 to driver amplifier 1162 and HPA drain voltage 1124 to high-power amplifier 1164. Bias power supply 1120 can also be interfaced with drain current sensor 1126, which can then provide data and/or control signals to processor 1140 that can be utilized in controlling RF generator 1150.

Power management system 1130 can be any sort of power management system as described in the present disclosure or in the various applications incorporated by reference. For example, power management system can be configured to perform a variety of functions including, but not limited to, turning on/off or reduce voltages/currents provided to various terminals of an amplifier in response to detecting that the signal to be amplified is turned on/off or sensing individual amplifier current values and change the values of different voltages and currents in response to the deviations of the sensed current values from target values. In the embodiment shown, power management system 1130 can provide driver gate voltage 1132 to driver amplifier 1162 and HPA gate voltage 1134 to high-power amplifier 1164. In some embodiments, modular power amplifier 1100 can be configured to operate at a duty cycle of between 0.1% to 100% (or continuous wave), with the duty cycle able to be manually set by a user or adjusted by the power management system. The power management system 1130 can be configured to interface with the RF generator 1150. The power management system 1130 can synchronize the turning on/off the amplifiers in the amplifier chain 1160 synchronously with the turning on/off the RF generator 1150.

Processor 1140 can be connected to power management system 1130 and/or the RF generator 1150. Processor 1140 can also receive data from drain current sensor 1122 to provide information about amplifier chain 1160. The processor 1140 can be configured to set various parameters of the RF generator 1150 (e.g., duty cycle, waveform type) and/or the amplifiers in the amplifier chain 1160 (e.g., gain) based on instructions from a user or an external computing device.

RF generator 1150 can include direct digital synthesizer (DDS) module 1152 to generate digital RF waveforms. The digital RF waveforms can then be provided to a digital-to-analog converter (DAC) 1154 to be converted to an analog RF output to be amplified by amplifier chain 1160.

Amplifier chain 1160 can include any number of amplifiers. However, in the example embodiment of FIG. 11, amplifier chain 1160 includes driver amplifier 1162 and high-power amplifier 1164. In certain embodiments, filter 1166 may be included between fiber amplifier 1162 and high-power amplifier 1164. The amplified RF output 1170 can then be delivered from modular power amplifier.

Figure 12:
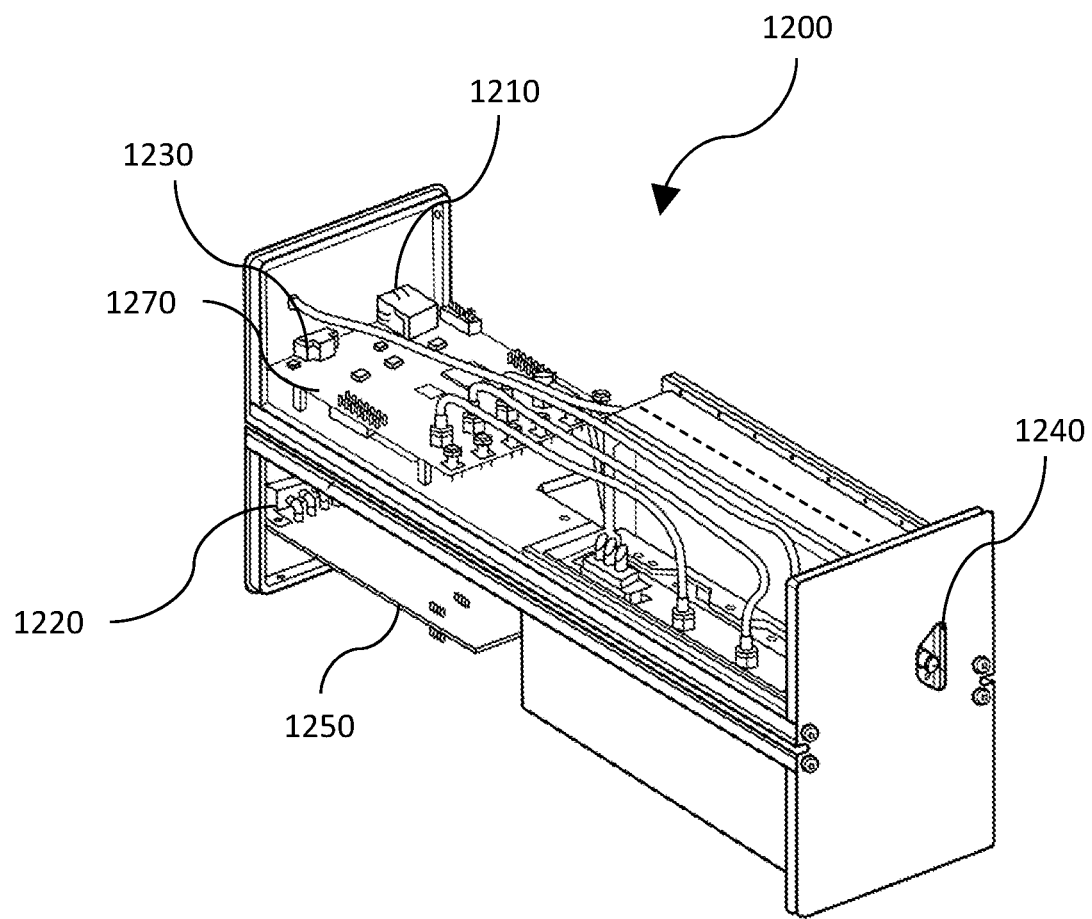
FIG. 12 is a simplified diagram illustrating modular power amplifier, in accordance with certain aspects of the present disclosure.

FIG. 12 is a simplified diagram illustrating modular power amplifier, in accordance with certain aspects of the present disclosure. As shown in FIG. 12, an exemplary embodiment of a modular power amplifier 1200 can include many of the components disclosed herein, allowing, for example, efficient replacement of damaged or upgraded modules. For example, the modular power amplifier 1200 can include an RF input port 1210, a power input port 1220, a digital control port 1230, and an RF output port 1240. Such ports simplify the connections needed to operate and maintain the amplifier system. FIG. 12 also depicts components including power distribution module 1250 and power sequencer 1270. Without any loss of generality, many aspects of the modular power amplifier 1200 can be similar to aspects of the modular power amplifier 1000 described above.

Figure 13:
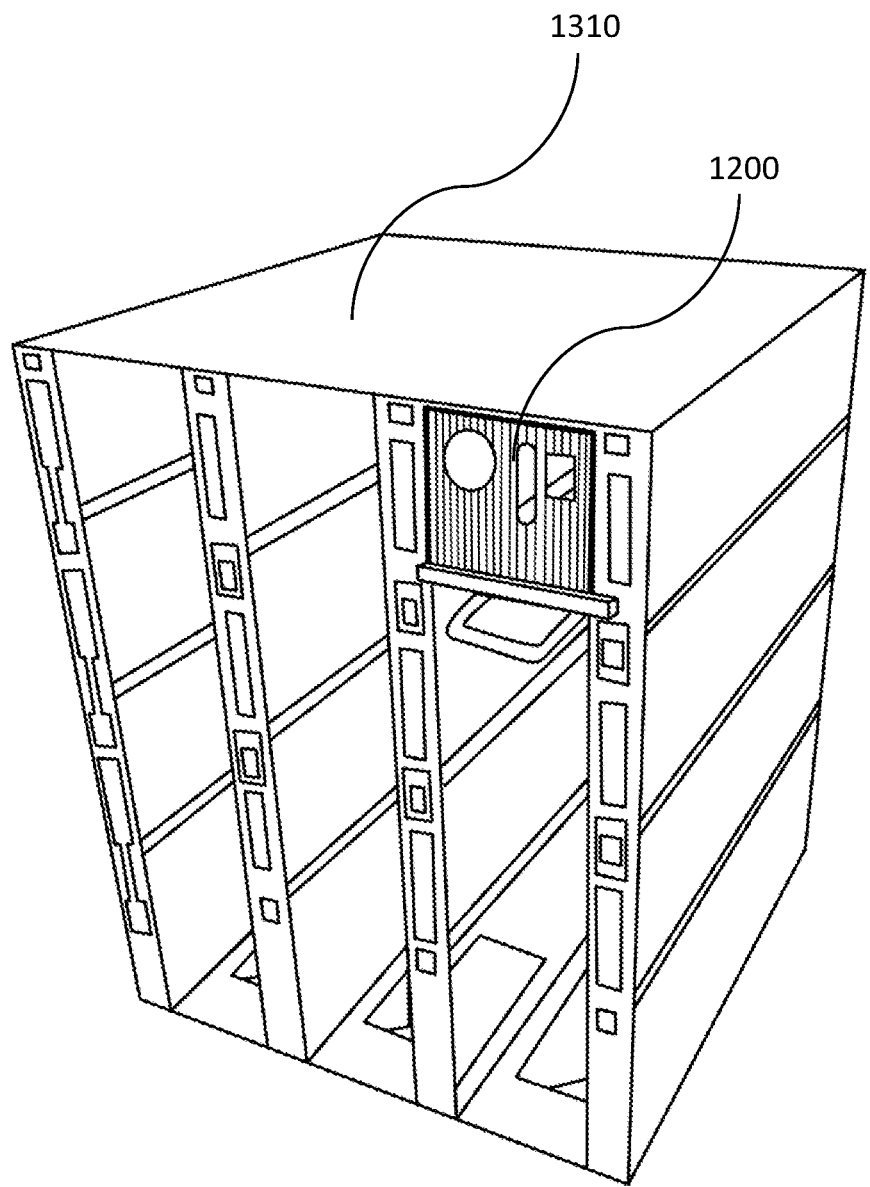
FIG. 13 is a simplified diagram illustrating a rack for multiple modular power amplifiers, in accordance with certain aspects of the present disclosure.

FIG. 13 illustrates an exemplary embodiment of a rack 1310 suitable for holding one or more modular power amplifiers 1200. The rack 1310 can be a lattice-shaped structure configured to receive any number of modular power amplifiers. Rack 1310 can include guides and spacers between installed modular power amplifiers or RF power sources to enable the proper alignment and spacing to enable various improvments disclosed herein, such as wavelength separations between amplifiers or incorporating shielding into the structure of the rack for further EMI mitigation. For example, one implementation of the disclosed systems can include those having an RF generator configured to generate RF signals at a particular wavelength. The system can include amplifiers (such as may be held in rack 1310) that can be configured to receive and amplify the RF signals. As mentioned previously, certain implementations can have the amplifiers separated from each other by at least approximately half of the wavelength to reduce EMI. As used herein, the term "approximately half of the wavelength," or the like, is understood to allow for some variation around the half-wavelength, but which still effectively mitigates EMI between adjacent amplifier components. For example, the separation can vary by up to 35% around the half-wavelength and still be considered within the scope of the present disclosure. As described in greater detail below, some implementations of the disclosed systems can include a power management system configured to control one or more of the amplifiers based on information received from various sensing circuits monitoring RF signal generation.

In some implementations, the separation between individual racks 1310 comprising amplifiers can be spaced apart by a separation distance that is in a range between approximately 0.2 times the wavelength and about 10.0 times the wavelength of the signal amplified by the amplifiers. For example, the separation between individual racks 1310 can be approximately 0.25 times the wavelength, 0.3 times the wavelength, 0.4 times the wavelength, 0.5 times the wavelength, 0.6 times the wavelength, 0.7 times the wavelength, 1.0 times the wavelength, 1.5 times the wavelength, 2.0 times the wavelength, 2.5 times the wavelength, 3.0 times the wavelength, 4.0 times the wavelength, 5.0 times the wavelength, 7.0 times the wavelength, 10.0 times the wavelength, or any separation therebetween. In other implementations, separations can be between approximately 2-18 inches or 3-7 inches. As discussed above, increasing the spacing separation between individual racks 1310 can allow integration of antennas with the larger areas (e.g., horn antenna designs) with amplifiers which can provide larger antenna gain. Such systems can be useful to provide higher power with smaller number of antenna elements.

In the following, further features, characteristics, and exemplary technical solutions of the present disclosure will be described in terms of items that may be optionally claimed in any combination:

Item 1: A compact directed energy system configured to generate directed energy beams, the compact directed energy system comprising a radio frequency system configured to provide a directed energy beam in a frequency range between 500 MHz to 20 Ghz.

Item 2. The compact directed energy system as in Item 1 or any of the Items depending from Item 1, further configured to be mounted to an unmanned aerial vehicle and configured to generate directed energy beams during a flight of the unmanned aerial vehicle.

Item 3. The compact directed energy system as in Item 1 or any of the Items depending from Item 1, sufficiently compact to be handheld by a user.

Item 4. The compact directed energy system as in Item 1 or any of the Items depending from Item 1, sufficiently compact to be contained in a backpack.

Item 5. The compact directed energy system as in Item 1 or any of the Items depending from Item 1, wherein the directed energy beam is in frequency range between 500 MHz and 5 GHz.

Item 6. The compact directed energy system as in Item 1 or any of the Items depending from Item 1, wherein the directed energy beam is in frequency range between 500 MHz and 1 GHz.

Item 7. The compact directed energy system as in Item 1 or any of the Items depending from Item 1, wherein the radio frequency system comprises a plurality of amplifiers connected to a backplane configured to support portions of the radiofrequency system.

Item 8. The compact directed energy system as in Item 1 or any of the Items depending from Item 1, wherein the backplane comprises: a central backplane; and one or more backplane extensions configured to support additional portions of the radiofrequency system.

Item 9. The compact directed energy system as in Item 1 or any of the Items depending from Item 1, wherein the central backplane and the one or more backplane extensions are approximately centered along an axis extending through a center of gravity of the compact directed energy system.

Item 10. The compact directed energy system as in Item 1 or any of the Items depending from Item 1, wherein the one or more backplane extensions are symmetrically disposed about the central backplane.

Item 11. The compact directed energy system as in Item 1 or any of the Items depending from Item 1, further comprising: a housing substantially enclosing components of the compact directed energy system comprising: a radio frequency (RF) signal generator; an amplifier system configured to amplify signals from the RF signal generator; a battery power system configured to supply power to the RF signal generator and the amplifier system; and a bias power controller configured to sense a characteristic of the amplifier system and adjust bias power to the amplifier system based on the sensed characteristic, wherein a ratio of a radiated power generated by the compact directed energy system to a volume of the housing is greater than about 0.001 kW/cm3 and less than about 5000 kW/cm3.

Item 12. The compact directed energy system as in Item 1 or any of the Items depending from Item 1, wherein the characteristic comprises an input signal power, an output signal power, a gain, a current, a voltage, a temperature, a resistance, a capacitance, or an inductance.

Item 13. The compact directed energy system as in Item 1 or any of the Items depending from Item 1, wherein the housing is configured to be mounted on the unmanned aerial vehicle.

Item 14. The compact directed energy system as in Item 1 or any of the Items depending from Item 1, wherein the amplifier system comprises a solid-state amplifier.

Item 15. The compact directed energy system as in Item 1 or any of the Items depending from Item 1, wherein the system is configured to output electromagnetic radiation in the L-band.

Item 16. The compact directed energy system as in Item 1 or any of the Items depending from Item 1, wherein the housing does not comprise active cooling.

Item 17. The compact directed energy system as in Item 1 or any of the Items depending from Item 1, wherein a ratio of the radiated power generated by the compact directed energy system to a volume of the housing is greater than about 0.22 W/cm3 and less than about 2500 kW/cm3.

Item 18. The compact directed energy system as in Item 1 or any of the Items depending from Item 1, further comprising: a housing enclosing: a radio frequency (RF) signal generator configured to generate a plurality of phase shifted signals; an array of amplifiers configured to amplify the plurality of phase shifted signals; a battery power system configured to supply power to the array of amplifiers; and a bias power controller configured to sense a characteristic of an amplifier in an array and adjust bias power to the amplifier based on the sensed characteristic, wherein a volume of the housing is between 1000 cm3 and 100,000 cm3.

Item 19. The compact directed energy system as in Item 1 or any of the Items depending from Item 1, wherein a ratio of a radiated power generated by the compact directed energy system to a volume of the housing is between 0.001 kW/cm3 and less than about 5000 kW/cm3.

Item 20. The compact directed energy system as in Item 1 or any of the Items depending from Item 1, wherein the volume of the housing is approximately 15000 cm3.

Item 21. The compact directed energy system as in Item 1 or any of the Items depending from Item 1, wherein the sensed characteristic comprises an input signal power, an output signal power, a gain, a current, a voltage, a temperature, a resistance, a capacitance, or an inductance.

Item 22. The compact directed energy system as in Item 1 or any of the Items depending from Item 1, wherein the housing is configured to be mounted on the unmanned aerial vehicle.

Item 23. The compact directed energy system as in Item 1 or any of the Items depending from Item 1, wherein the array of amplifiers comprises at least one solid-state amplifier.

Item 24. The compact directed energy system as in Item 1 or any of the Items depending from Item 1, further comprising: a housing configured to be mounted to the unmanned aerial vehicle, the housing containing: an electronic processing system, an array of amplifiers configured to amplify a plurality of radio frequency (RF) signals; and a battery power system configured to supply power to the array of amplifiers, wherein the electronic processing system is configured to dynamically change a power or a frequency of the directed energy beam generated by the compact directed energy system.

Item 25. The compact directed energy system as in Item 1 or any of the Items depending from Item 1, wherein the plurality of RF signals is generated by an RF signal generator.

Item 26. The compact directed energy system as in Item 1 or any of the Items depending from Item 1, wherein the plurality of RF signals is generated by a plurality of RF signal generators.

Item 27. The compact directed energy system as in Item 1 or any of the Items depending from Item 1, further comprising a bias power controller configured to sense a characteristic of an amplifier in the array of amplifiers and adjust bias power to the amplifier based on the sensed characteristic.

Item 28. The compact directed energy system as in Item 1 or any of the Items depending from Item 1, wherein the electronic processing system is configured to dynamically change a position of the directed energy beam.

Item 29. The compact directed energy system as in Item 1 or any of the Items depending from Item 1, wherein the housing further comprises an array of antennae configured to receive the plurality of the amplified signals.

Item 30. The compact directed energy system as in Item 1 or any of the Items depending from Item 1, wherein the array of antennae emit pulsed electromagnetic radiation.

Item 31. The compact directed energy system as in Item 1 or any of the Items depending from Item 1, wherein the pulsed electromagnetic radiation comprises a plurality of pulses with a duty cycle less than 10%.

Item 32. The compact directed energy system as in Item 1 or any of the Items depending from Item 1, wherein the battery power system comprises at least one battery.

Item 33. The compact directed energy system as in Item 1 or any of the Items depending from Item 1, wherein the battery power system comprises a plurality of capacitors configured to provide DC power during operation of the RF system.

Item 34. The compact directed energy system as in Item 1 or any of the Items depending from Item 1, wherein the plurality of signals are phase shifted with respect to each other.

Item 35. The compact directed energy system as in Item 1 or any of the Items depending from Item 1, wherein the plurality of signals are synchronized with each other.

Item 36. The compact directed energy system as in Item 1 or any of the Items depending from Item 1, further comprising: a housing substantially enclosing: an array of amplifiers configured to amplify signals from a plurality of signal sources; and a battery power system configured to supply power to the array of amplifiers, wherein the radio frequency system is configured to generate a directed energy beam towards a target electronic system, and wherein the signals from the plurality of signal sources are configured to have a frequency matched to a resonance frequency of the target electronic system.

Item 37. The compact directed energy system as in Item 1 or any of the Items depending from Item 1, further comprising a wireless transceiver, wherein the compact directed energy system is configured to: count a number of completed RF pulses delivered by the compact directed energy system; and automatically reestablish a wireless connection utilizing the wireless transceiver when the number of completed RF pulses is equal to a desired number of pulses.

Item 38. The compact directed energy system as in Item 1 or any of the Items depending from Item 1, further comprising a power management system, wherein the power management system is configured to: count a number of completed RF pulses delivered by the compact directed energy system; and automatically enter an idle state when the number of completed RF pulses is equal to a desired number of pulses, where the idle state includes one or more components operating at reduced power until a next pulse train is initiated.

Item 39: A system comprising: an RF power source comprising: an RF generator configured to generate RF signals having a wavelength; a plurality of amplifiers configured to receive and amplify the RF signals from the RF generator; and a power management system configured to control one or more of the plurality of amplifiers based on information received that is associated with the RF signals.

Item 40: The system as in Item 39 or any of the Items depending from Item 39, further comprising a housing containing components of the RF power source, the housing having a front panel and a rear panel, the housing including a power input port and RF output port.

Item 41: The system as in Item 39 or any of the Items depending from Item 39, the housing further comprising an error indicator, an RF indicator, a synch in, and a synch out.

Item 42: The system as in Item 39 or any of the Items depending from Item 39, the housing further comprising a power switch and one or more fans.

Item 43: The system as in Item 39 or any of the Items depending from Item 39, further comprising: a rack configured to receive the RF power source, the rack having one or more spacers to create a separation between the RF power source from another RF power source.

Item 44: The system as in Item 39 or any of the Items depending from Item 39, wherein the separation is at least approximately 0.5 times the wavelength.

Item 45: The system as in Item 39 or any of the Items depending from Item 39, wherein the separation is at least approximately 0.3 times the wavelength.

Item 46: The system as in Item 39 or any of the Items depending from Item 39, wherein the wavelength is within the L-band.

Item 47: The system as in Item 39 or any of the Items depending from Item 39, wherein the separation is between approximately 3-7 inches.

Item 48: The system as in Item 39 or any of the Items depending from Item 39, wherein the RF power source is configured to generate a plurality of wavelengths of RF signals and the separation is approximately the smallest wavelength of the plurality of wavelengths.

Item 49: The system as in Item 39 or any of the Items depending from Item 39, the RF power source further comprising: a power amplifier subsystem comprising: a first 90 degree hybrid block configured to receive an RF signal and output a split RF signal with components having a 90 degree phase shift; a second 90 degree hybrid block configured to receive and combine the split RF signal by removing the 90 degree phase shift; and a high-power amplifier, in the plurality of amplifiers, configured to amplify at least one of the components of the split RF signal; and a power sequencer configured to control the timing of power delivery by the power distribution module.

Item 48: The system as in Item 39 or any of the Items depending from Item 39, further comprising: a first high-power amplifier configured to receive a first RF signal and output a first amplified RF signal; a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier, wherein the different orientations have an angle of 90 degrees between them to form a portion of a square distribution of high-power amplifiers; and a third high-power amplifier having an orientation substantially perpendicular to the first high-power amplifier and a fourth high-power amplifier having an orientation substantially perpendicular to the second high-power amplifier.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can comprise implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" (or "computer readable medium") refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" (or "computer readable signal") refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, computer programs and/or articles depending on the desired configuration. Any methods or the logic flows depicted in the accompanying figures and/or described herein do not necessarily require the particular order shown, or sequential order, to achieve desirable results. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. The implementations described above can be directed to various combinations and subcombinations of the disclosed features and/or combinations and subcombinations of further features noted above. Furthermore, above described advantages are not intended to limit the application of any issued claims to processes and structures accomplishing any or all of the advantages.

Additionally, section headings shall not limit or characterize the invention(s) set out in any claims that may issue from this disclosure. Further, the description of a technology in the "Background" is not to be construed as an admission that technology is prior art to any invention(s) in this disclosure. Neither is the "Summary" to be considered as a characterization of the invention(s) set forth in issued claims. Furthermore, any reference to this disclosure in general or use of the word "invention" in the singular is not intended to imply any limitation on the scope of the claims set forth below. Multiple inventions may be set forth according to the limitations of the multiple claims issuing from this disclosure, and such claims accordingly define the invention (s), and their equivalents, that are protected thereby.

What is claimed is:

1. A system configured to generate directed energy beams, the system comprising:
    a radio frequency system comprising:
        a battery power system with at least one battery configured to provide power;
        an amplifier system having at least one solid-state amplifier that receives the power from the battery power system and configured to amplify RF energy; and
        an antenna for receiving the RF energy and configured to provide the RF energy in a directed energy beam in a frequency range between 500 MHz to 20 Ghz; and
    a wireless transceiver, wherein the system is configured to:
        count a number of completed RF pulses delivered by the system; and
        automatically reestablish a wireless connection utilizing the wireless transceiver when the number of completed RF pulses is equal to a desired number of pulses.

2. A system configured to generate directed energy beams, the system comprising:
    a radio frequency system comprising:
        a battery power system with at least one battery configured to provide power;
        an amplifier system having at least one solid-state amplifier that receives the power from the battery power system and configured to amplify RF energy; and
        an antenna for receiving the RF energy and configured to provide the RF energy in a directed energy beam in a frequency range between 500 MHz to 20 Ghz; and
    a power management system with a programmable processor, wherein the power management system utilizing the programmable processor is configured to:
        count a number of completed RF pulses delivered by the system; and
        automatically enter an idle state when the number of completed RF pulses is equal to a desired number of pulses, where the idle state includes one or more components operating at reduced power until a next pulse train is initiated.

3. A system comprising:
an RF power source comprising:
an RF generator configured to generate RF signals having a wavelength;
a plurality of amplifiers configured to receive and amplify the RF signals from the RF generator; and
a power management system with a programmable processor, wherein the power management system utilizing the programmable processor is configured to control one or more of the plurality of amplifiers based on information received that is associated with the RF signals.

4. The system of claim 3, further comprising a housing containing components of the RF power source, the housing having a front panel and a rear panel, the housing including a power input port and RF output port.

5. The system of claim 4, the housing further comprising an error indicator, an RF indicator, a synch in, and a synch out.

6. The system of claim 4, the housing further comprising a power switch and one or more fans.

7. The system of claim 3, further comprising: a rack configured to receive the RF power source, the rack having one or more spacers to create a separation between the RF power source from another RF power source.

8. The system of claim 7, wherein the separation is at least approximately 0.5 times the wavelength.

9. The system of claim 7, wherein the separation is at least approximately 0.3 times the wavelength.

10. The system of claim 7, wherein the wavelength is within the L-band.

11. The system of claim 10, wherein the separation is between approximately 3-7 inches.

12. The system of claim 7, wherein the RF power source is configured to generate a plurality of wavelengths of RF signals and the separation is approximately the smallest wavelength of the plurality of wavelengths.

13. The system of claim 3, the RF power source further comprising:
a power amplifier subsystem comprising:
a first 90 degree hybrid block configured to receive an RF signal and output a split RF signal with components having a 90 degree phase shift;
a second 90 degree hybrid block configured to receive and combine the split RF signal by removing the 90 degree phase shift; and
a high-power amplifier, in the plurality of amplifiers, configured to amplify at least one of the components of the split RF signal; and
a power sequencer configured to control the timing of power delivery by a power distribution module.

14. The system of claim 3, further comprising:
a first high-power amplifier configured to receive a first RF signal and output a first amplified RF signal;
a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier, wherein the different orientations have an angle of 90 degrees between them to form a portion of a square distribution of high-power amplifiers; and
a third high-power amplifier having an orientation substantially perpendicular to the first high-power amplifier and a fourth high-power amplifier having an orientation substantially perpendicular to the second high-power amplifier.

* * * * *